United States Patent
Xu

(10) Patent No.: US 10,586,659 B2
(45) Date of Patent: Mar. 10, 2020

(54) PEROVSKITE PHOTOVOLTAIC DEVICE

(71) Applicant: Tao Xu, Lisle, IL (US)

(72) Inventor: Tao Xu, Lisle, IL (US)

(73) Assignee: Board of Trustees of Northern Illinois University, DeKalb, IL (US)

( * ) Notice: Subject to any disclaimer, the term of this patent is extended or adjusted under 35 U.S.C. 154(b) by 0 days.

(21) Appl. No.: 15/564,950

(22) PCT Filed: Apr. 6, 2015

(86) PCT No.: PCT/US2015/024574
§ 371 (c)(1),
(2) Date: Oct. 6, 2017

(87) PCT Pub. No.: WO2016/163985
PCT Pub. Date: Oct. 13, 2016

(65) Prior Publication Data
US 2018/0108491 A1    Apr. 19, 2018

(51) Int. Cl.
*H01G 9/20* (2006.01)
*H01G 9/00* (2006.01)
(Continued)

(52) U.S. Cl.
CPC ......... *H01G 9/2031* (2013.01); *H01G 9/0036* (2013.01); *H01G 9/2009* (2013.01);
(Continued)

(58) Field of Classification Search
CPC .. H01G 9/2031; H01G 9/0036; H01G 9/2009; H01L 51/0032; H01L 51/4226
(Continued)

(56) References Cited

U.S. PATENT DOCUMENTS 10,388,898 B2   8/2019  Xu
2011/0220192 A1   9/2011  Tajabadi et al.
(Continued)

FOREIGN PATENT DOCUMENTS

CN   105047826   11/2015
CN   106098141   11/2016
(Continued)

OTHER PUBLICATIONS

Qiu et al., All-solid-state hybrid solar cells based on a new organometal halide perovskite sensitizer and one-dimensional tiO2 nanowire arrays, Nanoscale, vol./issue 5, pp. 3245-3248 (Year: 2013).*
(Continued)

*Primary Examiner* — Jayne L Mershon
(74) *Attorney, Agent, or Firm* — Evan Law Group LLC

(57) ABSTRACT

A photovoltaic device, comprises (1) a first conductive layer, (2) an optional blocking layer, on the first conductive layer, (3) a semiconductor layer, on the first conductive layer, (4) a light-harvesting material, on the semiconductor layer, (5) a hole transport material, on the light-harvesting material, and (6) a second conductive layer, on the hole transport material. The light-harvesting material comprises a perovskite absorber, and the second conductive layer comprises nickel. The semiconductor layer may comprise $TiO_2$ nanowires. The light-harvesting material may comprise a perovskite absorber containing a pseudohalogen.

22 Claims, 11 Drawing Sheets

(51) Int. Cl.
H01L 51/42 (2006.01)
H01L 51/00 (2006.01)
(52) U.S. Cl.
CPC ...... H01L 51/0032 (2013.01); H01L 51/4226 (2013.01); *Y02E 10/549* (2013.01)
(58) Field of Classification Search
USPC .......................................................... 136/255
See application file for complete search history.

(56) References Cited

U.S. PATENT DOCUMENTS

| | | | |
|---|---|---|---|
| 2013/0025681 A1 | 1/2013 | Kang et al. | |
| 2014/0332078 A1 | 11/2014 | Guo et al. | |
| 2015/0122314 A1* | 5/2015 | Snaith | H01L 51/4213 136/255 |
| 2015/0129034 A1* | 5/2015 | Snaith | H01L 51/4213 136/258 |
| 2015/0136232 A1* | 5/2015 | Snaith | H01L 51/4226 136/263 |
| 2015/0200377 A1* | 7/2015 | Etgar | H01L 51/005 136/256 |
| 2015/0249170 A1* | 9/2015 | Snaith | H01L 51/422 136/256 |
| 2016/0359119 A1 | 12/2016 | Hayashi et al. | |
| 2016/0380125 A1* | 12/2016 | Snaith | H01L 51/0032 136/256 |
| 2017/0330693 A1 | 11/2017 | Lunt, III | |
| 2018/0108491 A1 | 4/2018 | Xu | |
| 2018/0350527 A1 | 12/2018 | Xu | |

FOREIGN PATENT DOCUMENTS

| | | |
|---|---|---|
| EP | 2 693 503 | 2/2014 |
| WO | 2016/163985 | 10/2016 |

OTHER PUBLICATIONS

Wen et al., Solvothermal synthesis of ultralong single-crystalline TiO2 nanowires, New Journal of Chemistry (Royal Society of Chemistry), pp. 1-9 (Year: 2005).*
Liu, M. et al., "Efficient planar heterojunction perovskite solar cells by vapour deposition", Nature, vol. 501, pp. 395-398, (2013).
Burschka, J. et al., "Sequential deposition as a route to high-performance perovskite-sensitized solar cells", Nature, vol. 499, pp. 316-320, (2013).
Kazim, S. et al., "Perovskite as light harvester: A game changer in photovoltaics", Angewandte Chemie International Edition, vol. 53, pp. 2812-2824, (2014).
Stranks, S.D. et al., "Electron-hole diffusion lengths exceeding 1 micrometer in an organometal trihalide perovskite absorber", Science, vol. 342, pp. 341-344, (2013).
Leijtens, T. et al., "Overcoming ultraviolet light instability of sensitized $TiO_2$ with meso-superstructured organometal tri-halide perovskite solar cells", Nature Communications, vol. 4, pp. 1-8, (2013).
Hao, F. et al., "Lead-free solid-state organic-inorganic halide perovskite solar cells", Nature Photonics, vol. 8, pp. 489-494, (2014).
Qin, P. et al., "Inorganic hole conductor-based lead halide perovskite solar cells with 12.4% conversion efficiency", Nature Communications, vol. 5, pp. 1-6, (2014).
Christians, J.A. et al., "An inorganic hole conductor for organo-lead halide perovskite solar cells improved hole conductivity with copper iodide", Journal of the American Chemical Society, vol. 136, pp. 758-764, (2014).
Li, H. et al., "A simple 3,4-ethylenedioxythiophene based hole-transporting material for perovskite solar cells", Angewandte Chemie International Edition, vol. 53, pp. 4085-4088, (2014).
Zhu, Z. et al., "Efficiency enhancement of perovskite solar cells through fast electron extraction: The role of graphene quantum dots", Journal of American Chemical Society, vol. 136, pp. 3760-3763, (2014).

Ku, Z. et al., "Full printable processed mesoscopic $CH_3NH_3PbI_3$/ $TiO_2$ heterojunction solar cells with carbon counter electrode", Scientific Reports, vol. 3, pp. 1-5, (2013).
Lide, D.R. "Handbook on Chemistry and Physics", 88th ed., CRC: Boca Raton, FL, p. 2640, (2008).
Feng, X. et al., "Rapid charge transport in dye-sensitized solar cells made from vertically aligned single-crystal rutile $TiO_2$ nanowires", Angewandte Chemie International Edition, vol. 51 pp. 2727-2730, (2012).
Etgar, L. et al., "Mesoscopic $CH_3NH_3PBi_3/TiO_2$ heterojunction solar cells", Journal of the American Chemical Society, vol. 134, pp. 17396-17399, (2012).
Zhao, Y. et al., "Charge transport and recombination in perovskite $(CH_3NH_3)PbI_3$, sensitized $TiO_2$ solar cells", Journal of Physical Chemistry Letters, vol. 4, pp. 2880-2884, (2013).
Snaith, H.J. et al., "Anomalous hysteresis in perovskite solar cells", Journal of Physical Chemistry Letters, vol. 5, pp. 1511-1515, (2014).
Dualeh, A. et al., "Impedance spectroscopic analysis of lead iodide perovskite-sensitized solid-state solar cells", ACS Nano, vol. 8, pp. 362-373, (2014).
Green, M.A., "Solar cells: Operating principles, technology and system applications", Prentice-Hall, Inc., pp. 96-97, (1982).
Jiang, Q. et al., "Rutile $TiO_2$ nanowires perovskite solar cells", Electronic Supplementary Information, Chemical Communications, pp. 1-4, (2014).
O'Regan, B.C. et al., "Measuring charge transport from transient photovoltage rise times. A new tool to investigate electron transport in nanoparticle films", Journal of Physical Chemistry B, vol. 110, pp. 17155-17160, (2006).
Jiang, Q. et al., "Nickel-cathoded perovskite solar cells", The Journal of Physical Chemistry C, vol. 118, pp. 25878-25883, with supplemental information, pp. 1-4, (2014).
Jiang, Q. et al., "Rutile $TiO_2$ nanowire-based perovskite solar cells", Chemical Communication, vol. 50, pp. 14720-14723, (2014).
Niu, G. et al., "Study on the stability of $CH_3NH_3PbI_3$ films and the effect of post-modification by aluminum oxide in all-solid-state hybrid solar cells", Journal of Materials Chemistry A, vol. 2, pp. 705-710, (2014).
Abate, A. et al., "Supramolecular halogen bond passivation of organic-inorganic halide perovskite solar cells", Nano Letters, vol. 14, pp. 3247-3254, (2014).
Yang, J. et al., "Investigation of $CH_3NH_3PbI_3$ degradation rates and mechanisms in controlled humidity environments using in situ techniques", ACS Nano, vol. 9, pp. 1955-1963, (2015).
Chen, Q. et al., "Controllable self-induced passivation of hybrid lead iodide perovskites toward high performance solar cells", Nano Letters, vol. 14, pp. 4158-4163, (2014).
Park, B-W. et al., "Enhanced crystallinity in organic-inorganic lead halide perovskites on mesoporous $TiO_2$ via disorder-order phase transition", Chemistry of Materials, vol. 26, pp. 4466-4471, (2014).
Baikie, T. et al., "Synthesis and crystal chemistry of the hybrid perovskite $(CH_3NH_3)PbI_3$ for solid-state sensitized solar cell applications", Journal of Materials Chemistry A, vol. 1, pp. 5628-5641, (2013).
Chiang, C-H. et al., "Bulk heterojunction perovskite-PCBM solar cells with high fill factor", Nature Photonics, vol. 10, pp. 196-200, (2016).
Liu, D. et al., "Perovskite solar cells with a planar heterojunction structure prepared using room-temperature solution processing techniques", Nature Photonics, vol. 8, pp. 133-138, (2014).
Noorden, R.V., "Cheap solar cells tempt businesses: Easy-to-make perovskite films rival silicon for efficiency", Nature, vol. 513, p. 470, (2014).
Jiang, Q. et al., "Pseudohalide-induced moisture tolerance in perovskite $CH_3NH_3Pb(SCN)_2I$ thin films", Angewandte Chemie International Edition, vol. 54, pp. 7617-7620, (2015).
Miyata, A. et al., "Direct measurement of the exciton binding energy and effective masses for charge carriers in an organic-inorganic tri-halide perovskite", Nature Physics, vol. 11, pp. 582-587, (2015).
Chen. Y. et al., "Extended carrier lifetimes and diffusion in hybrid perovskites revealed by hall effect and photoconductivity measurements", Nature Communications, vol. 7, pp. 1-9, (2016).

(56) References Cited

OTHER PUBLICATIONS

Shi, D. et al., "Low trap-state density and long carrier diffusion in organolead trihalide perovskite single crystals", Science, vol. 347, issue 6221, pp. 519-522, (2015).
Wehrenfennig, C. et al., "High charge carrier mobilities and lifetimes in organolead trihalide perovskites", Advanced Materials, vol. 26, pp. 1584-1589, (2014).
Bi, Y. et al., "Charge carrier lifetimes exceeding 15 µs in methylammonium lead iodide single crystals", The Journal of Physical Chemistry Letters, vol. 7, pp. 923-928, (2016).
Im, J-H. et al., "Growth of $CH_3NH_3PbI_3$ cuboids with controlled size for high-efficiency perovskite solar cells", Nature Nanotechnology, vol. 9, pp. 927-932, (2014).
Kaltenbrunner, M. et al., "Flexible high power-per-weight perovskite solar cells with chromium oxide-metal contacts for improved stability in air", Nature Materials, vol. 14, pp. 1032-1039, (2015).
Green, M.A. et al., "The emergence of perovskite solar cells", Nature Photonics, vol. 8, pp. 506-514, (2014).
Jeon, N.J. et al., "Solvent engineering for high-performance inorganic-organic hybrid perovskite solar cells", Nature Materials, vol. 13, pp. 897-903, (2014).
Nie, W. et al., "High-efficiency solution-processed perovskite solar cells with millimeter-scale grains", Science, vol. 347, issue 6221, pp. 522-525, (2015).
Chen, W. et al., "Efficient and stable large-area perovskite solar cells with inorganic charge extraction layers", Science, vol. 350, pp. 944-948, (2015).
Noh, J.H. et al., "Chemical management for colorful, efficient, and stable inorganic-organic hybrid nanostructured solar cells", Nano Letters, vol. 13, pp. 1764-1769, (2013).
Zhu, H. et al., "Lead halide perovskite nanowire lasers with low lasing thresholds and high quality factors", Nature Materials, vol. 14, pp. 636-642, (2015).
Fu, Y. et al., "Nanowire lasers of formamidinium lead halide perovskites and their stabilized alloys with improved stability", Nano Letters, vol. 16, pp. 1000-1008, (2016).
Fu, Y. et al., "Broad wavelength tunable robust lasing from single-crystal nanowires of cesium lead halide perovskites ($CsPbX_3$, X = Cl, Br, I)", ACS Nano, vol. 10, pp. 7963-7972, (2016).
Frost, J.M. et al., "Atomistic origins of high-performance in hybrid halide perovskite solar cells", Nano Letters, vol. 14, pp. 2584-2590, (2014).
Leguy, A.M.A. et al., "The dynamics of methylammonium ions in hybrid organic-inorganic perovskite solar cells", Nature Communications, vol. 6, pp. 1-10, (2015).
You, J. et al., "Improved air stability of perovskite solar cells via solution-processed metal oxide transport layers", Nature Nanotechnology, vol. 11, pp. 75-81, (2016).
Meloni, S. et al., "Ionic polarization-induced current-voltage hysteresis in $CH_3NH_3PbX_3$ perovskite solar cells", Nature Communications, vol. 7, pp. 1-9, (2016).
Frost, J.M. et al., "Molecular ferroelectric contributions to anomalous hysteresis in hybrid perovskite solar cells", APL Materials, vol. 2, pp. 081506-1-081506-10, (2014).
Gratzel, M., "The light and shade of perovskite solar cells", Nature Materials, vol. 13, pp. 838-842, (2014).
Li, X., et al., "Improved performance and stability of perovskite solar cells by crystal crosslinking with alkylphosphonic acid ω-ammonium chlorides", Nature Chemistry, vol. 7, pp. 703-711, (2015).
Binek, A. et al., "Stabilization of the trigonal high-temperature phase of formamiclinium lead iodide", The Journal of Physical Chemistry Letters, vol. 6, pp. 1249-1253, (2015).
Tai, Q. et al., "Efficient and stable perovskite solar cells prepared in ambient air irrespective of the humidity", Nature Communications, vol. 7, pp. 1-8, (2016).
Cao, D.H. et al., "2D homologous perovskites as light-absorbing materials for solar cell applications", Journal of the American Chemical Society, vol. 137, pp. 7843-7850, (2015).
Daub, M. et al., "Synthesis, single-crystal structure and characterization of $(CH_3NH_3)_2Pb(SCN)_2I_2$", Angewandte Chemie International Edition, vol. 54, pp. 11016-11017, (2015).
Tsai, H. et al., "High-efficiency two-dimensional ruddlesden-popper perovskite solar cells", Nature, vol. 536, pp. 312-316, (2016).
Xiao, Z. et al., "Photovoltaic properties of two-dimensional $(CH_3NH_3)_2Pb(SCN)_2I_2$ Perovskite: A combined experimental and density functional theory study", The Jornal of Physical Chemistry Letters, vol. 7, pp. 1213-1218, (2016).
Ogomi, Y. et al., "$CH_3NH_3Sn_xPb_{(1-x)}I_3$ perovskite solar cells covering up to 1060 nm", The Journal of Physical Chemistry Letters, vol. 5, pp. 1004-1011, (2014).
Chen, Q. et al., "Under the spotlight: The organic-inorganic hybrid halide perovskite for optoelectronic applications", Nano Today, vol. 10, pp. 355-396, (2015).
Sutter-Fella, C.M. et al., "High photoluminescence quantum yield in band gap tunable bromide containing mixed halide perovskites", Nano Letters, vol. 16, pp. 800-806, (2016).
Yang, M. et al., "Facile fabrication of large-grain $CH_3NH_3PbI_{3-x}Br_x$ films for high-efficiency solar cells via $CH_3NH_3Br$-selective ostwald ripening", Nature Communications, vol. 7, pp. 1-9, (2016).
Zhao, Y. et al., "Efficient planar perovskite solar cells based on 1.8 eV band gap $CH_2NH_3PbI_2Br$ nanosheets via thermal decomposition", Journal of the American Chemical Society, vol. 136, pp. 12241-12244, (2014).
Kong, L. et al., "Simultaneous band-gap narrowing and carrier-lifetime prolongation of organic-inorganic trihalide perovskites", Proceeding of the National Academy of Science, vol. 113, pp. 8910-8915, (2016).
Evers, W.H. et al., "High charge mobility in two-dimensional percolative networks of PbSe quantum dots connected by atomic bonds", Nature Communications, vol. 6, pp. 1-8, (2015).
Miller, E.M. et al., "Revisiting the valence and conduction band size dependence of PbS quantum dot thin films", ACS Nano, vol. 10, pp. 3302-3311, (2016).
Ekuma, C.E. et al., "Optical properties of PbTe and PbSe", Physical Review B, vol. 85, pp. 085205-1-08205-7, (2012).
Zhang, N. et al., "Narrow band gap lead sulfide hole transport layers for quantum dot photovoltaics", Applied Materials & Interfaces, vol. 8, pp. 21417-21422, (2016).
Svane, A. et al., "Quasiparticle self-consistent GW calculations for PbS, PbSe, and PbTe: Band structure and pressure coefficients", Physical Review B, vol. 81, pp. 245120-1-245120-10, (2010).
Primera-Pedrozo, O. et al., "Room temperature synthesis of PbSe quantum dots in aqueous solution: Stabilization by interactions with ligands", Nanoscale, vol. 4, pp. 1312-1320, (2012).
Heo, J.H. et al., "Efficient inorganic-organic hybrid heterojunction solar cells containing perovskite compound and polymeric hole conductors", Nature Photonics, vol. 7, pp. 486-491, (2013).
Eperon, G.E. et al., "Morphological control for high performance, solution-processed planar heterojunction perovskite solar cells", Advanced Functional Materials, vol. 24, pp. 151-157, (2014).
Lee, J-H. et al., "Role of hydrogen-bonding and its interplay with octahedral tilting in $CH_3NH_3PbI_3$", Chemical Communication, vol. 51, pp. 6434-6437, (2015).
Ong, K.P. et al., "Structural evolution in methylammonium lead iodide $CH_3NH_3PbI_3$", The Journal of Physical Chemistry, vol. 119, pp. 11033-11038, (2015).
Stoumpos, C.C. et al., "Semiconducting tin and lead iodide perovskites with organic cations: Phase transitions, high mobilities, and near-infrared photoluminescent properties", Inorganic Chemistry, vol. 52, pp. 9019-9038, (2013).
Navas, J. et al., "New insights into organic-inorganic hybrid perovskite $CH_3NH_3PbI_3$ nanoparticles. An experimental and theoretical study of doping in $Pb^{2+}$ sites with $Sn^{2+}$, $Sr^{2+}$, $Cd^{2+}$ and $Ca^{2+}$" Nanoscale, vol. 7, pp. 6216-6229, (2015).
Li, Z. et al., "Stabilizing perovskite structures by tuning tolerance factor: Formation of formamidinium and cesium lead iodide solid-state alloys", Chemistry of Materials, vol. 28, pp. 284-292, (2016).
Aguiar, J.A. et al., "Effect of water vapor, temperature, and rapid annealing on formamidinium lead triiodide perovskite crystallization", ACS Energy Letters, vol. 1, pp. 155-161, (2016).

(56) References Cited

OTHER PUBLICATIONS

Kim, M.K. et al., "Effective control of crystal grain size in $CH_3NH_3PbI_3$ perovskite solar cells with a pseudohalide $Pb(SCN)_2$ additive", CrystEngComm, vol. 18, pp. 6090-6095, (2016).
Gong, J. et al., "Electron-rotor interaction in organic-inorganic lead iodide perovskites discovered by isotope effects", The Journal of Physical Chemistry Letters, vol. 7, pp. 2879-2887, (2016).
Yang, M. et al., "Square-centimeter solution-processed planar $CH_3NH_3PbI_3$ perovskite solar cells with efficiency exceeding 15%", Advanced Materials, vol. 27, pp. 6363-6370, (2015).
Glaser, T. et al., "Infrared spectroscopic study of vibrational modes in methylammonium lead halide perovskites", The Journal of Physical Chemistry Letters, vol. 6, pp. 2913-2918, (2015).
Flender, O. et al., "Ultrafast photoinduced dynamics of the organolead trihalide perovskite $CH_3NH_3PbI_3$ on mesoporous $TiO_2$ scaffolds in the 320-920 nm range", Physical Chemistry Chemical Physics, vol. 17, pp. 19238-19246, (2015).
Fornaro, T. et al., "Hydrogen-bonding effects on infrared spectra from anharmonic computations: Uracil-water complexes and uracil dimers", The Journal of Physical Chemistry A, vol. 119, pp. 4224-4236, (2015).
Al-Adhami, L. et al., "Band-broadening in infra-red spectra of gaseous hydrogen-bonded complexes", Nature, vol. 211, pp. 1291, (1966).
Yang, J-H. et al., "Fast self-diffusion of ions in $CH_3NH_3PbI_3$: the interstiticaly mechanism versus vacancy-assisted mechanism", Journal of Materials Chemistry A, vol. 4, pp. 13105-13112, (2016).
Yang, T-Y. et al., "The significance of ion conduction in a hybrid organic-inorganic lead-iodide-based perovskite photosensitizer", Angewandte Chemie International Edition, vol. 54, pp. 7905-7910, (2015).
Yuan, Y. et al., "Electric-field-driven reversible conversion between methylammonium lead triiodide perovskites and lead iodide at elevated temperatures", Advanced Energy Materials, vol. 6, pp. 1501803-1-1501803-7, (2016).
Freitag, M. et al., "Dye-sensitized solar cells for efficient power generation under ambient lighting", Nature Photonics, vol. 11, pp. 372-379, (2017).
Saparov, B. et al., "Organic-inorganic perovskites: structural versatility for functicnal materials design", Chemical Reviews, vol. 116, pp. 4558-4596, (2016).
Stoumpos, C.C. et al., "Ruddlesden-popper hybrid lead iodide perovskite 2D homologous semiconductors", Chemistry of Materials, vol. 28, pp. 2852-2867, (2016).
Tauc, J. et al., "Optical properties and electronic structure of amorphous germanium", Physica Status Solidi, vol. 15, pp. 627-637, (1966).
Tauc, J. "Optical properties of non-crystalline solids", Optical Properties of Solids, Chapter 5, pp. 277-313, (1972).
International Search Report and Written Opinion dated Jul. 9, 2015 for PCT application No. PCT/US2015/24574, 21 pages.
"Perovskite solar cell", Wikipedia, found at https://en.wikipedia.org/wiki/Perovskite_solar_cell, pp. 1-7, printed on Mar. 14, 2015.
Gong, J. et al., "Divalent anionic doping in perovskite solar cells for enhanced chemical stability", Advanced Materials, vol. 30, issue 34, pp. 1800973-1-1800973-6, (2018).
Ku, Z. et al., "A mesoporous nickel counter electrode for printable and reusable perovskite solar cells", Nanoscale, vol. 7, pp. 13363-13368, (2015).
Nejand, B.A. et al., "New physical deposition approach for low cost inorganic hole transport layer in normal architecture of durable perovskite solar cells", Applied Materials & Interfaces, vol. 7, pp. 21807-21818, (2015).
No. of pp. 11, Apr. 10, 2019, U.S. Appl. No. 15/614,438.
U.S. Appl. No. 16/507,724, filed Jul. 10, 2019.
U.S. Appl. No. 15/614,438, filed Jun. 5, 2017.
No. of pp. 7, Jul. 12, 2018, U.S. Appl. No. 15/614,438.
No. of pp. 20, Oct. 5, 2018, U.S. Appl. No. 15/614,438.

\* cited by examiner

US 10,586,659 B2

PEROVSKITE PHOTOVOLTAIC DEVICE

FEDERALLY SPONSORED RESEARCH OR DEVELOPMENT

This invention was made with government support under CBET-1150617 awarded by the National Science Foundation. The government has certain rights in the invention.

BACKGROUND

Photovoltaic (PV) systems are systems that convert light into electricity. All photovoltaic systems share a few common parts. All photovoltaic systems include a light-harvesting element, a charge-separating element, a charge-transporting element(s), and a charge collecting element(s).

A perovskite solar cell is a type of solar cell which includes a perovskite absorber (that is, light-harvesting element). A perovskite absorber has an $ABX_3$ formula, where A is a metal atom such as lead or tin, B is a counter ion (typically an alkyl ammonium compound), and X is a halide (F, Cl, Br, or I). The name "perovskite" refers to the crystal structure of the absorber materials, which has a perovskite structure. The most commonly studied perovskite absorber is methylammonium lead trihalide ($CH_3NH_3PbX_3$, where X is a halogen ion such as I—, Br—, Cl—), with a bandgap between 2.3 eV and 1.57 eV depending on halide content. Formamidinium lead trihalide ($H_2NCHNH_2PbX_3$) is a recently studied newer material which shows promise, with a bandgap between 2.23 eV and 1.48 eV.

These hybrid organic-inorganic solid state solar cells with perovskite structured $CH_3NH_3PbI_3$ as active layer have recently been reported with over 15% efficiency,[1,2] which emerges as the most promising candidate for the next-generation solar cells. As a game changer in photovoltaics, perovskite-type material exhibits striking excellence in both light absorption[3] and charge transport (1069 nm electron diffusion length and 1213 nm holes diffusion length).[4] Despite its aura, the dark side of this rising star should not be ignored such as the stability issue of $CH_3NH_3PbI_3$,[5] the use of environment-hazardous lead,[6] the cost of complex organics as hole-blocking layer,[7,8] and the use of expensive noble metals as back cathode. In order to maximize the attainable open circuit voltage ($V_{oc}$), low chemical potential, namely, high work function noble metals, such as gold[2,9,10] and silver,[1] are generally used as back cathode. Thermal evaporation of gold is a very costly and wasteful process because only a tiny portion of the gold is eventually deposited onto the devices. Therefore, replacing gold with earth-abundant elements as the cathode in perovskite solar cells while still retaining their high $V_{oc}$ and energy conversion efficiency is a pivotally critical step toward the cost-effective production of perovskite solar cells.

SUMMARY

In a first aspect, the present invention is a photovoltaic device, comprising (1) a first conductive layer, (2) an electron blocking layer, on the first conductive layer, (3) a semiconductor layer, on the electron blocking layer, (4) a light-harvesting material, on the semiconductor layer, (5) a hole transport material, on the light-harvesting material, and (6) a second conductive layer, on the hole transport material. The light-harvesting material comprises a perovskite absorber, and the second conductive layer comprises nickel or cobalt.

In a second aspect, the present invention is a photovoltaic device, comprising (1) a first conductive layer, (2) an electron blocking layer, on the first conductive layer, (3) a semiconductor layer, on the electron blocking layer, (4) a light-harvesting material, on the semiconductor layer, (5) a hole transport material, on the light-harvesting material, and (6) a second conductive layer, on the hole transport material. The light-harvesting material comprises a perovskite absorber, and the semiconductor layer comprises $TiO_2$ nanowires.

In a third aspect, the present invention is a method of forming the photovoltaic device of any one of the preceding claims, comprising forming the first conductive layer, and the electron blocking layer on the first conductive layer; forming the semiconductor layer, on the first conductive layer; applying the light-harvesting material, onto the semiconductor layer; forming the hole transport layer, on the semiconductor layer; and forming the second conductive layer, on the hole transport layer.

In a fourth aspect, the invention is a photovoltaic device, comprising (1) a first conductive layer, (2) an electron blocking layer, on the first conductive layer, (3) a semiconductor layer, on the electron blocking layer, (4) a light-harvesting material, on the semiconductor layer, (5) a hole transport material, on the light-harvesting material, and (6) a second conductive layer, on the hole transport material. The light-harvesting material comprises a perovskite absorber containing a pseudohalogen.

Definitions

A "perovskite solar cell" or "perovskite-type solar cell" is a solar cell which includes a perovskite absorber as the light-harvesting element.

A "perovskite absorber" is a compound of formula $ABX_3$, where A is a metal atom such as lead or tin, B is a counter ion (typically an alkyl ammonium compound), and X is a halide (F, Cl, Br, or I) or pseudohalide (such as SCN), which forms crystals of the perovskite structure. Examples include $CH_3NH_3PbX_3$ and $H_2NCHNH_2PbX_3$ and $CH_3NH_3Pb(SCN)_2I$

DETAILED DESCRIPTION

The present invention makes use of the discovery that noble metals may be replaced with nickel, as the back cathode. In the quest for high work function metals, noble metals such as gold, platinum, or silver often come up as the routine choice. The present invention break down this stereotype selection rule for perovskite-type solar cells using nickel as the back cathode. Nickel has a unit price less than 0.03% of that of gold. The present invention also makes use of the discovery that TiO$_2$ nanowires may be used to efficiently collect electrons generated from the perovskite light harvesting elements in perovskite solar cells. The present invention also makes use of the discovery that by replacing two iodide with two pseudohalogens, that is, thiocynide ions, (—SCN), a new perovskite material CH$_3$NH$_3$Pb(SCN)$_2$I has been developed that exhibits much better moisture-tolerance than the conventional CH$_3$NH$_3$PbI$_3$. The three discoveries may be used independent of the other, or preferably used together.

Figure 1A:
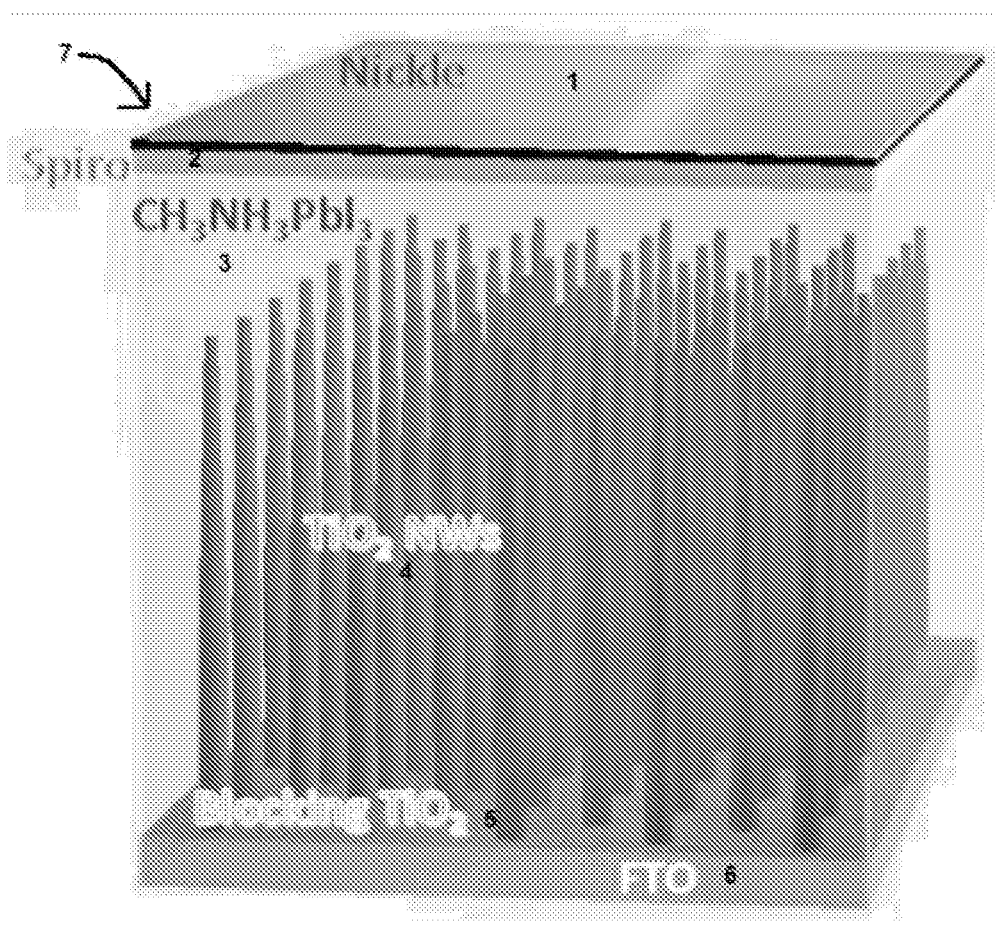
FIG. 1A shows a schematic diagram of a perovskite solar cell with listed components being preferred: a fluorinated tin oxide (FTO) anode covered with a electron blocking $TiO_2$ thin film, rutile $TiO_2$ nanowires, spin-coated $CH_3NH_3PbI_3$ layer, or spin-coated $CH_3NH_3Pb(SCN)_2I$ layer and spiro-MeTAD layer, followed by a sputtered nickel cathode.
Figure 1B:
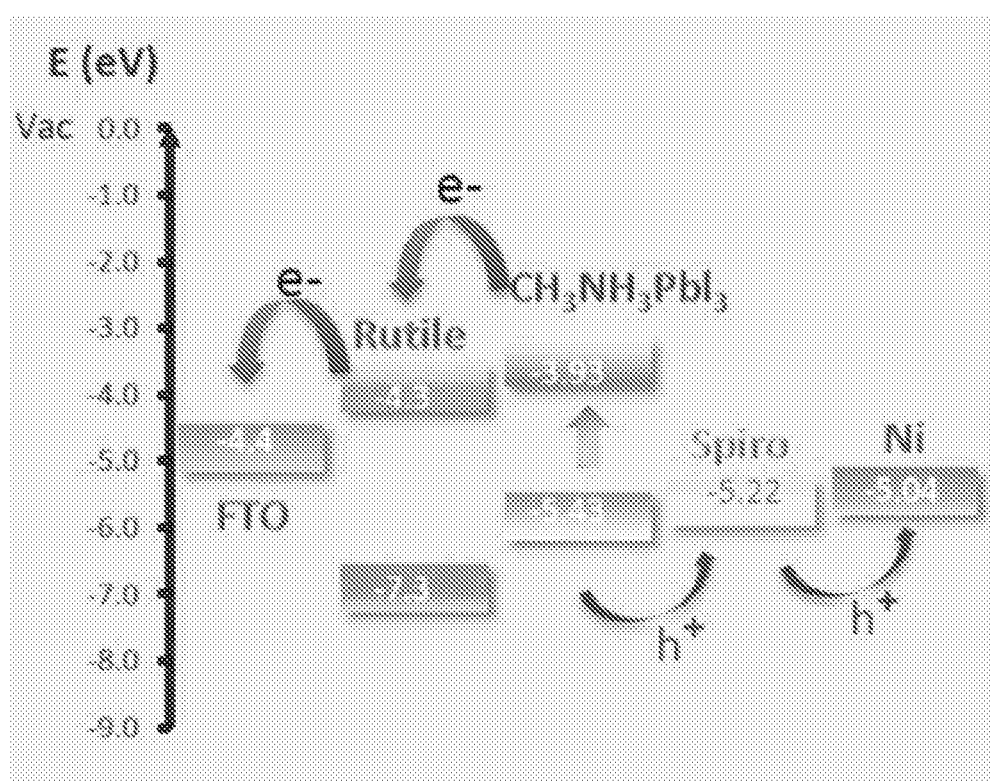
FIG. 1B shows the energy diagram of the device of FIG. 1A.

FIG. 1A illustrates a solar cell, 7, with preferred materials listed; other materials for each of the different layers may be used instead of those listed. The solar cell includes a first conductive layer, 6; an electron blocking layer, 5, on the electron blocking layer, a semiconductor layer, 4, on the first conductive layer; a light-harvesting material, 3, on the semiconductor layer; a hole-transporting material, 2, on the semiconductor layer; and a second conductive layer, 1, on the hole-transporting material.

Preferably, the first conductive layer is transparent, so that light may penetrate one side of the device and reach the light-harvesting material. Optionally, the first conductive layer may be on a substrate. Examples of substrates include glass, quartz and transparent polymeric materials, such as polycarbonate. Examples of transparent conductive layers include indium-tin oxide, fluorinated tin oxide, and aluminum-zinc oxide. Graphene may also be used as the first conductive layer. The first conductive layer may also be formed as a composite material and/or formed as multiple layers. For example, a planar substrate of glass may be coated with a layer of fluorinated tin oxide, and fine particles of fluorinated tin oxide applied to the surface and sintered together to provide the substrate and first conductive layer.

In an alternative configuration, such as that described in Patent Application Publication, Pub. No. US 2011/0220192, the first conductive layer, with the semiconductor layer and light harvesting material, are on the support, but spaced away from the electrode and second conducting layer, and not in direct electrical contact therewith. In operation of this alternative configuration, light does not need to travel through the first conductive layer, so a non-transparent conductive layer may be used, for example a metal such as nickel, gold, silver or platinum, or a conductive oxide, such as electrically conductive titanium suboxides.

The optional blocking layer, which serves to bind defective sites and suppress back electron transfer, and may have a different composition than the semiconductor layer, and is preferably a transparent insulating material, for example titanium dioxide (TiO$_2$), magnesium oxide (MgO), aluminum oxide (Al$_2$O$_3$), zirconium oxide (ZrO$_2$), boron nitride (BN), silicon oxide (SiO$_2$), diamond (C), barium titanate (BaTiO$_3$), and mixtures thereof. The blocking layer may also be formed of a transparent semiconductor material and preferably is an n-type semiconductor, for example titanium dioxide (TiO$_2$), zinc oxide (ZnO), zirconium oxide (ZrO$_2$), tungsten oxide (WO$_3$), molybdenum oxide (MoO$_3$), lead oxide (PbO), and mixtures thereof, or mixtures thereof with a transparent insulating material. It is important that the blocking layer be both conformal and compact.

The optional blocking layer preferably has a thickness of at most 2 nm, or may be present in an amount of at most 10 atomic layers. It may also be present as islands on the surface of the semiconductor layer, in which case the thickness may be expressed as an average thickness across the semiconductor layer, for example as less than one atomic layer.

The semiconductor layer, which is n-doped or n-type, may be a transparent semiconductor, such as titanium dioxide (TiO$_2$), zinc oxide (ZnO), zirconium oxide (ZrO$_2$), tungsten oxide (WO$_3$), molybdenum oxide (MoO$_3$), lead oxide (PbO) or mixtures thereof. Preferably, the semiconductor layer has a thickness of at most 100 nm, for example 1 to 100 nm, including 5, 10, 15, 20, 25, 30, 35, 40, 45, 50, 55, 60, 65, 70, 75, 80, 85, 90 and 95 nm. If the semiconductor layer is not intrinsically formed as an n-type semiconductor, such as is the case with TiO$_2$, is may be chemically n-doped.

The semiconductor layer may be formed by physical vapor deposition, such as evaporation or sputtering, or by chemical deposition, such as atomic layer deposition, or by forming a thin layer of a precursor which is then decomposed to form the semiconductor layer. Electrochemical deposition or deposition from solution, may also be used in the case of conductive polymers. The thickness may be controlled by the amount of semiconductor initially deposited, or by removing deposited semiconductor by etching, such as chemical etching. The semiconductor layer may also be formed by applying a dispersion of fine particles of the semiconductor dispersed into a fluid, for example particles have an average diameter of 5 to 100 nm, including 10, 20, 30, 40, 50, 60, 70, 80 or 90 nm, dispersed in water, or an organic solvent for example alcohols such as methanol or ethanol, or mixtures thereof. Sintering may be desirable to remove the solvent and/or improve the contact between the semiconductor layer and the first conductive layer, or to improve the crystallinity of the semiconductor layer. It is important that the semiconductor layer both conformal and compact. Ideally, the contact between the first conductive layer and the semiconductor layer should be an ohmic contact.

Atomic layer deposition may be carried out by chemical reaction of two compounds which react to form the semiconductor layer. The structure onto which the semiconductor layer is to be deposited is exposed to vapors of the first of the two chemicals, and then exposed to the vapors or gasses of the second of the two chemicals. If necessary, the exposure and/or reaction may be carried out at elevated temperatures. In some instances, byproducts of the reaction may need to be removed before repeating the process, by washing, evacuation, or by the passage of an inert gas over the structure. The process may be repeated until the desired thickness of the semiconductor layer is formed. For example, in the case of the transparent oxide semiconductors, which are typically compounds of a metal and oxygen, the first chemical may be a halide, such as a chloride, bromide or iodide, an oxychloride, oxybromide or oxyiodide, organometallic compounds, alkoxides of the metal and other ceramic precursor compounds (such as titanium isopropoxide), as well as mixtures thereof. The second chemical may be water ($H_2O$), oxygen ($O_2$ and/or $O_3$) or a gaseous oxidizing agent, for example $N_2O$, as well as mixtures thereof. Inert gasses, such as helium, argon or nitrogen may be used to dilute the gasses during the process.

In a preferred alternative embodiment, the semiconductor layer is composed of $TiO_2$ nanowires. The nanowires may be prepared by solvothermal method with controllable length-to-diameter ratio and are well separated.[13] Preferably, the length of the $TiO_2$ nanowires is 400-1100 nm, more preferably 600-1000 nm, including 700, 800 and 900 nm.

The light-harvesting material is a perovskite absorber, a compound of formula $ABX_3$, where A is a metal atom such as lead or tin, B is a counter ion (typically an alkyl ammonium compound), and X is a halide (F, Cl, Br, or I) or pseudohalide such as SCN (thiocynide ion), which forms crystals of the perovskite structure. Examples include $CH_3NH_3PbX_3$ and $H_2NCH_3NCHNH_2PbX_3$. Preferably, the light-harvesting material is applied by spin-coating so that it fills spaces on and in the semiconductor layer.

The hole-transporting material may be a solid p-type semiconductor, for example CuI, CuSCN, $CuAlO_2$, NiO, and mixtures thereof, as well as p-doped conductive polymers. Conductive polymers include poly(acetylene)s, poly(pyrrole)s, poly(thiophene)s, polyanilines, polythiophenes, poly(p-phenylene sulfide), poly(para-phenylene vinylene)s (PPV) and PPV derivatives, poly(3-alkylthiophenes), polyindole, polypyrene, polycarbazole, polyazulene, polyazepine, poly(fluorene)s, and polynaphthalene. Other examples include polyaniline, polyaniline derivatives, polythiophene, polythiophene derivatives, polypyrrole, polypyrrole derivatives, polythianaphthene, polythianaphthane derivatives, polyparaphenylene, polyparaphenylene derivatives, polyacetylene, polyacetylene derivatives, polydiacethylene, polydiacetylene derivatives, polyparaphenylenevinylene, polyparaphenylenevinylene derivatives, polynaphthalene, and polynaphthalene derivatives, polyisothianaphthene (PITN), polyheteroarylenvinylene (ParV), in which the heteroarylene group can be for example thiophene, furan or pyrrol, polyphenylene-sulphide (PPS), polyperinaphthalene (PPN), and polyphthalocyanine (PPhc), and their derivatives, copolymers thereof and mixtures thereof. As used herein, the term derivatives means the polymer is made from monomers substituted with side chains or groups. P-doping of the solid semiconductor and the conductive polymers may be carried out chemically, if necessary, for example by treatment with an oxidizing agent, such as oxygen, fluorine or iodine, or by electrochemical oxidation. A preferred hole-transporting material is spiro-MeO-TAD (2,2'7,7'-tetrakis(N,N-di-p-methoxyphenyl amine)-9,9'-spirobifluorene).

A second conductive layer is in contact with the hole-transporting material, and is preferably formed of a highly conductive and chemically unreactive material, for example gold, platinum, or metallic alloys. Preferably, the second conductive layer is nickel or a nickel alloy. The second conductive layer may be present on a third conductive layer, which may be formed of any conductive material. The second conductive layer serve to transport electrons back to the hole-transporting material, thus completing the electrical circuit. The second conductive layer is preferably on a support, which may be formed of any solid material, such as plastic, glass or metal. Preferably, the second conductive layer is formed by evaporation or sputtering.

As shown in FIG. 1A, using the preferred material listed on the illustration, the cell contains about 900 nm high rutile $TiO_2$ nanowire (NWs) array on FTO (fluorinated tin oxide) glass as the photoanode,[13] which is filled with a layer of spinning-coated $CH_3NH_3PbI_3$, a 220 nm thick spinning-coated spiro-MeOTAD (2,2'7,7'-tetrakis(N,N-di-p-methoxyphenyl amine)-9,9'-spirobifluorene) as hole transport material (HTM), capped by a sputtering-coated nickel film as the cathode.

EXAMPLES

Preparation of the Photoanodes having Rutile $TiO_2$ Nanowire Arrays on FTO.

The $TiO_2$ nanowire arrays are fabricated via a solvothermal method reported previously. In a typical process, FTO substrates coated with a layer of $TiO_2$ thin film were loaded into a sealed Teflon-lined stainless steel reactor filled with 6 mL of 2-butanone, 6 mL of 37% hydrochloric acid, and 0.5 mL of tetrabutyltitanate, and the mixture was then kept at 200° C. for 40 min. The obtained substrates with nanowire arrays were cleaned by dipping in a $H_2O_2$ (30 wt %)/$NH_4OH$ (25 wt %) (10:1 of volume ratio) solution for 10 min., followed by annealing at 450° C. for 30 min under an $O_2$ atmosphere. The obtained electrodes were then soaked in 40 mM $TiCl_4$ solution at 65° C. for 1 h, followed by rinsing with DI water. The $TiCl_4$-treated $TiO_2$ nanowires were annealed at 500° C. for 30 min.

Synthesis of $CH_3NH_3I$.

19.5 mL of methylamine (40 wt % water solution) was dropwisely added to 32.3 mL of hydroiodic acid (57 wt % in water, Aldrich) in an ice bath and under stirring for 2 h. The precipitate was recovered by extracting the mixture in a rotary evaporator at 50° C. The yellow/brown product was filtered and washed by diethyl ether to yield white powders, which was further purified by recrystallization in ethanol and diethyl ether.[14] The nuclear magnetic resonance (NMR, Bruker Avance III 500 MHz) spectrum of the product in d6-DMSO can be found in Figure S1 of the Supporting Information[21].

Preparation of Precursory $CH_3NH_3PbI_3$ Solution.

0.29 g (0.63 mmol) of $PbI_2$ and 0.1 g (0.63 mmol) of $CH_3NH_3I$ were dissolved in 0.5 mL of γ-butyrolactone solution at 60° C.[15]

Preparation of Precursory $CH_3NH_3Pb(SCN)_2I$ Solution.

$CH_3NH_3Pb(SCN)_2I$ precursory solution is prepared as following: 0.203 g $Pb(SCN)_2$ and 0.15 g $CH_3NH_3I$ were dissolved in 0.6 ml DMF under stirring at 60° C. for 3 hours.

Preparation of HTM Solution.

92 mg of 2,2',7,7'-tetrakis(N,N-di-p-methoxyphenylamine)-9,9'-spirobifluorene (spiro-MeOTAD), 7.2 mg of Li bis-trifluoromethane sulfonimide, and 12 mg of 4-tert-butylpyridine were dissolved in 1 mL of chlorobenzene.

Device Fabrication.

The precursory solution of $CH_3NH_3PbI_3$ or precursory solution of $CH_3NH_3Pb(SCN)_2I$ was spin-coated on the $TiO_2$ nanowire photoanodes at 2000 rpm for 1 min in ambient conditions. The deposited $CH_3NH_3PbI_3$ or $CH_3NH_3Pb(SCN)_2I$ film was dried in Ar at 105° C. for 10 min, followed by spinning coating HTM at 2500 rpm. Nickel was sputtered on the top of the HTM layer through a homemade aluminum mask to form the nickel pads as back cathodic electrode. Au films were deposited with an Edward 306A thermal evaporator with base pressure of $6\times10^{-6}$ Torr. Nickel thin films were deposited using the magnetron sputtering technique. The rotary magnetron sputtering system was customized by Denton Vacuum with DC power supplies. The system has sputtering targets set vertically. The based pressure of the deposition was $1\times10^{-6}$ Torr, and the deposition pressure was 3 mTorr of Ar. The distance of substrate-to-target is 7 cm. The Ni target was ignited at the power of 80 W and presputtered for 5 min. The samples were then moved to the sputtering zone in a horizontal cycling swiping manner (1 nm/loop, 6 s/loop). The growth rate was calibrated using SEM cross-section measurements. The temperature on the substrate surface is monitored with a set of irreversible temperature indicators (Cole-Palmer) ranging from 65 to 135° C. After sputtering under above conditions, none of the temperature labels turn black, suggesting that the temperature on substrate is below 65° C. during sputtering.

Structure Characterization and Other Measurement.

The morphologies and microstructures of the samples were characterization using a Hitachi-S4800 FE-SEM or a Tescan SEM (model Vega II SBH). The TEM and HR-TEM images were taken using a Tecnai F20 (FEI, Hillsboro, Oreg.) microscope at an accelerating voltage of 200 kV. The sheet resistance measurement is conducted using a Jandel four-probe sheet resistance measurement system.

Photovoltaic Performance Measurement.

The current density-voltage (J-V) curves were collected using a potentiostat (Gamry Reference 600) and the devices were illuminated at one sun 1.5 air mass global (AM G) spectrum provided by a solar simulator (Photo Emission Inc., Camarillo, Calif., model SS50B). It is reported that hysteresis appears in J-V measurement at low voltage scan rate (<150 mV/s).[16] This is seen in our initial study, and therefore, to minimize hysteresis, we set the voltage sweeping rate at 200 mV/s with a step of 2 mV, which is a fairly optimized setting.[17] This setting is applied to all J-V measurements in this work for fair comparisons between different devices. All devices were measured under the same measurement conditions as described above on day 1 (the day that the device was prepared), day 2, and day 5 to see if samples performance undergo any significant changes, at least, within the first 5 days. Between each measurement, the samples are stored in a desiccator. The open-circuit photovoltage transient was measured on Gamry Reference 600 in the Chronopotentiometry mode. An ultrafast optical shutter is used (UniBlitz model LS6, 700 μs from full closure to full open, aperture is 6 mm in diameter with a shutter driver model D 122) to control the incident sunlight. A commercial solid-state silicon photodiode (OSRAM Opto Semiconductor, BPX 61, response time 20 ns, spectral range 400-1100 nm, and active area 2.65 mm×2.65 mm=7 $mm^2$) is used as a reference to verify the measurement limit of our setup (Figure S2 in Supporting Information[21]).

Results and Discussion

Figure 2:
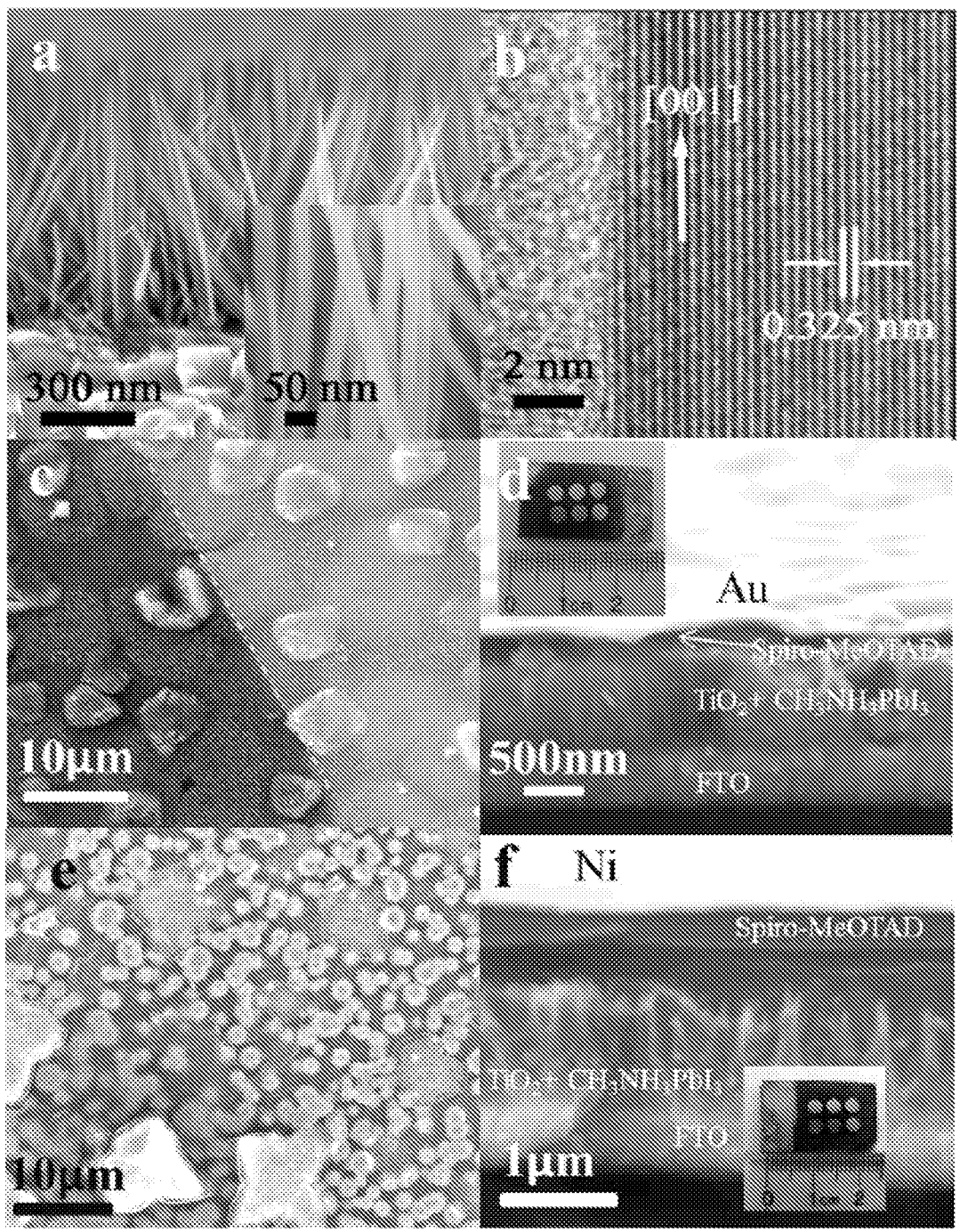
FIG. 2*a* is a SEM image of $TiO_2$ nanowires on a FTO substrate (inset: magnified SEM image).
FIG. 2*b* shows HR-TEM images of $TiO_2$ nanowires.
FIG. 2*c* is a SEM top-view image of a cell near the edge of a gold cathode.
FIG. 2*d* is a cross-section SEM image of a cell with gold as cathode (inset: digital photo of an actual device with six cells).
FIG. 2*e* is a SEM top view image of a cell near the edge of a nickel cathode.
FIG. 2*f* is a SEM cross section image of a cell with nickel as cathode (inset: digital photo of an actual device with six cells).

FIG. 2a is the scanning electron microscope (SEM) image of the ~900 nm $TiO_2$ nanowires array grown almost vertically on the FTO substrate. The diameter of $TiO_2$ nanowires is about 30-40 nm (see inset of FIG. 2a). The high-resolution transmission electron microscope (HRTEM) image in FIG. 2b suggests a single crystal feature of the nanowires. The (110) lattice crystal plane with a fringe spacing of 0.325 nm indicates that these nanowires are rutile $TiO_2$. FIG. 2c is the top-view SEM image of the cell near the edge (along the yellow dashed line) of a gold cathode. The lower left portion of FIG. 2c is the morphology of $TiO_2$ nanowire photoanode after spincoating with $CH_3NH_3PbI_3$ or $CH_3NH_3Pb(SCN)_2I$ and spiro-MeOTAD, while the upper right portion of FIG. 2c is the morphology after gold evaporation. It can be clearly seen that thermal evaporation of gold does not change the morphology of the underneath layers. FIG. 2d is the cross-section SEM image of a device with gold as cathode, in which each layer including the wrapped $TiO_2$ nanowires by $CH_3NH_3PbI_3$, or the $CH_3NH_3Pb(SCN)_2I$ layer, the spiro-MEOTAD layer, and the gold layer, can be identified. The thickness of spiro-MeOTAD is about 220 nm, which is the optimized thickness that yields the best efficiency we can achieve. The inset of FIG. 2d is the photo of the device with six gold cathodes. FIG. 2e is a top view of the cell near the edge (along the dashed line) of a nickel cathode. Unlike the shape edge found in the thermally evaporated gold cathode, the sputter nickel does not give a very sharp edge. The upper right part of FIG. 2e is covered with nickel, while the lower left part is intact. Nonetheless, it can still be seen that the morphology of the $CH_3NH_3PbI_3$ or $CH_3NH_3Pb(SCN)_2I$ layer and spiro-MeOTAD layer remains the same after sputtering compared with the parts that are not coated with nickel, indicating that the nickel sputtering process does not change the morphology of the spin-coated $CH_3NH_3PbI_3$ or the $CH_3NH_3Pb(SCN)_2I$ layer and spiro-MeOTAD layers under our optimized operational parameters. The inset of FIG. 2f shows six nickel cathodes. The diameter for all the cathodes is 3 mm.

Figure 3:
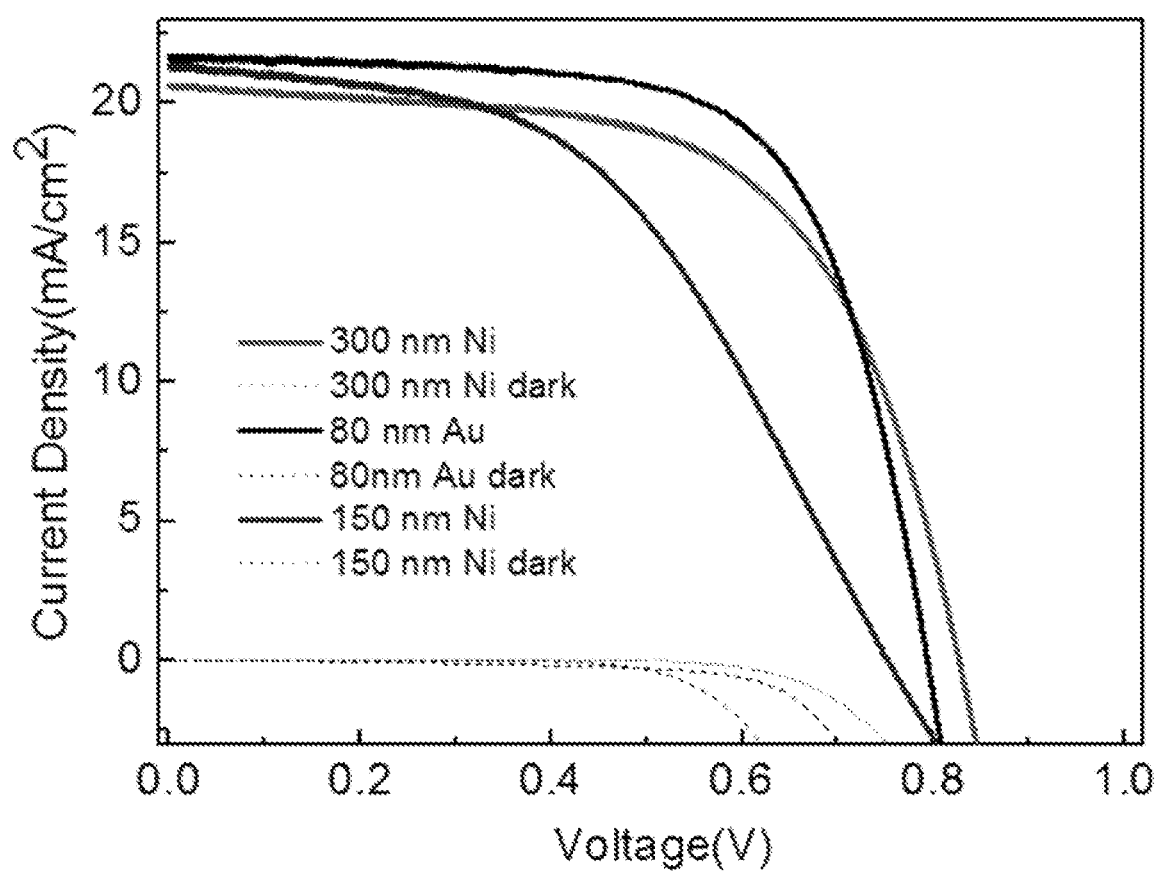
FIG. 3 is a graph of J-V characteristic under illumination (1 sun, 1.5 global air mass) and in dark for gold-backed and nickel-back cells. Both cells use 900 nm TiO$_2$ nanowires on FTO as anode for a fair comparison.

FIG. 3 shows the photocurrent density versus photovoltage (J-V) curves of cells using 900 nm $TiO_2$ nanowires as photoaondes and using 80 nm gold film, 150 nm nickel film, and 300 nm nickel film as cathodes, respectively. The photovoltaic performance of the cells are summarized in Table 1. It can been seen that the cell using 300 nm nickel film as cathode exhibits comparable energy conversion efficiency (η=10.4%) to that of the cell using 80 nm gold film as cathode (η=11.6%). However, the cells using 150 nm nickel film as the cathodes exhibits a notable drop in efficiency (η=7.7%).

TABLE 1

Photovoltaic Performance of Solar Cells with Ni and Au as Back Cathodes

| cathodes of cells | $J_{sc}$ (mA $m^{-2}$) | $V_{oc}$ (mV) | FF | η (%) | $R_{sh}$ (Ω) | $R_s$ (Ω) |
|---|---|---|---|---|---|---|
| Ni 150 nm | 21.4 | 752 | 0.50 | 7.7 | 11794.6 | 264.4 |
| Ni 300 nm | 20.6 | 830 | 0.61 | 10.4 | 13851.4 | 103.2 |
| Au 80 nm | 21.7 | 792 | 0.68 | 11.6 | 14160.9 | 81.5 |

To troubleshoot the source of energy loss in 150 nm nickel cathoded cells, short circuit current density ($J_{sc}$) for all cells are first compared. However, both cells exhibit almost the same $J_{sc}$, about 20 mA/$cm^{-2}$. Furthermore, $V_{oc}$ of the cell using 150 nm nickel as cathode is 0.752 V, only slightly lower than that of the cells using 80 nm gold or 300 nm Ni film as cathode. Then, compared to the fill factor (FF) of 68% for the cell using gold as cathode, it is the relatively low FF (50%) found in the cell using nickel as cathode that is responsible for its low conversion efficiency. Since there is no significant difference in $V_{oc}$ and $J_{sc}$ in comparison to the other two cells, we attribute the low FF in cell with 150 nm nickel cathode mainly to its high series resistance. Indeed, shunt resistance ($R_{sh}$) at $J_{sc}$ for 150 nm nickel-backed cell is 11 794Ω, which is about 80% of that for gold-backed cell, while the series resistance ($R_s$) at $V_{oc}$ for the nickel-backed cell is 264Ω, over 3 times higher than that of the gold-backed cell. The relations between current, fill factor, and shunt resistance are shown by the following equations[18]

$$FF_{SH} = FF_0\left(1 - \frac{1}{R_{SH}}\right) \quad (1)$$

$$I = I_L - I_0 \exp\left[\frac{qV}{nkT}\right] - \frac{V}{R_{SH}} \quad (2)$$

where I is the cell output current, $I_L$ is the light generated current, V is the voltage across the cell terminals, T is the temperature, q is the charge of an electron, k is Boltzmann constant, n is the ideality factor, and $R_{SH}$ is the cell shunt resistance. The idea cell which is not affected by any resistance is denoted by $I_0$ and $FF_0$.

The relations between current, fill factor, and series resistance are shown by eqs 3 and 4.[18] $R_s$ is the series resistance.

$$FF_s = FF_0(1 - R_s) \quad (3)$$

$$I = I_L - I_0 \exp\left[\frac{q(V + IR_s)}{nkT}\right] \quad (4)$$

Equations 1-4 can be combined to briefly estimate the respective impact from series resistance and shunt resistance on FF in comparison to an ideal solar cell. The simulated result suggests that the loss of FF in the cell with a nickel cathode is mainly caused by the high series resistance (Figure S2).[21] As supporting evidence, four-probe sheet resistance of the 80 nm thick gold cathodes is measured to be 0.2-0.4 Ω/square, in contrast to 90-100 Ω/square for the 150 nm thick nickel cathode. The two-probe measurement on the edge-to-edge resistance of gold pads is typically about 0.5Ω, in contrast to ~150Ω for nickel pads. Indeed, cells with a 100 nm thick nickel cathode, i.e. even higher series resistance, yield even lower FF as shown in Figure S3[21] and Table S1[21].

As we further increased the thickness of the nickel film to 300 nm thick, the FF of the cell increases to 0.61 and the conversion efficiency reaches 10.4%. The two-probe measurement on the edge-to-edge resistance of the 300 nm thick nickel pads is measured to be 3Ω, and the four-probe sheet resistance of the 300 nm thick nickel cathodes is measured to be 3-5 Ω/square.

Figure 4:
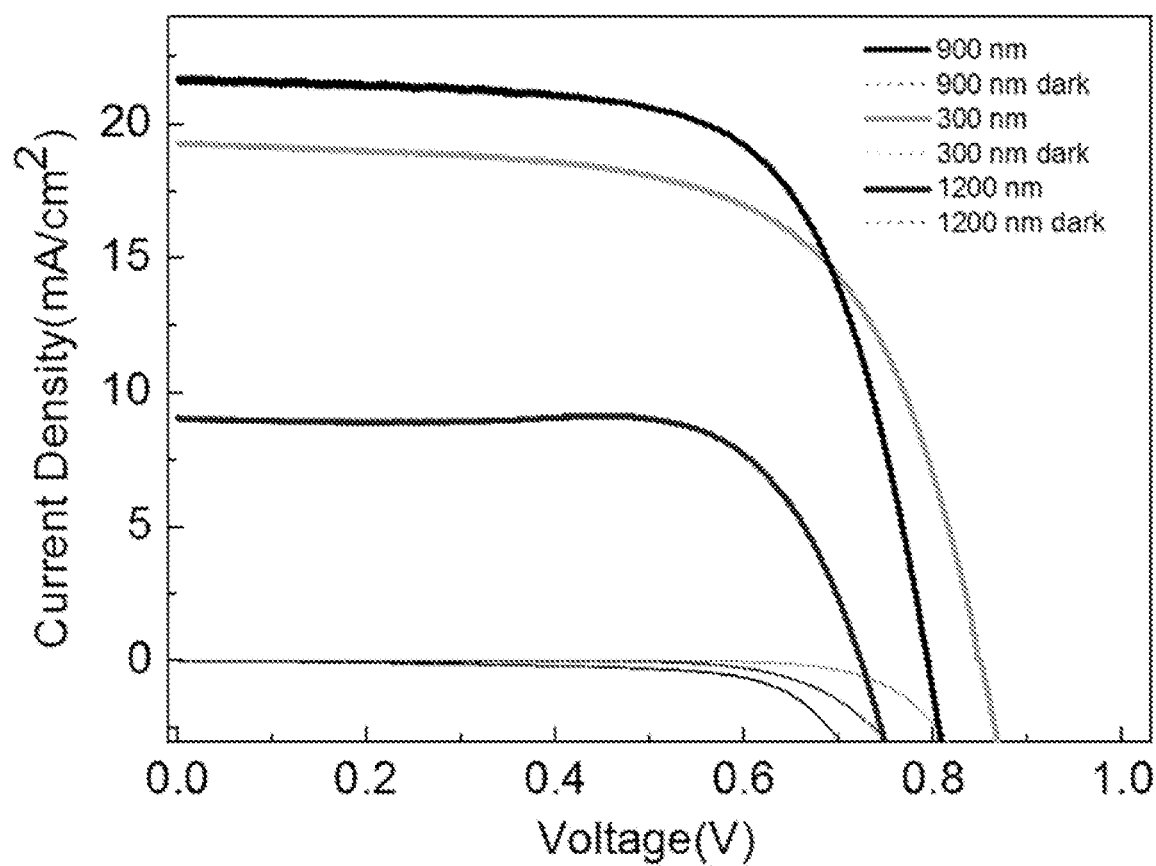
FIG. 4 is a graph of J-V curves of cells using 900, 300, and 1200 nm TiO$_2$ nanowires as anode and 80 nm thick gold as back electrode.

The effect of the length of the TiO$_2$ nanowires was also studied. The J-V curves of cells using 300, 900, and 1200 nm TiO$_2$ nanowires as photoanodes and 80 nm thick gold as back electrode cells are shown in FIG. 4 and Table 2. The result suggest that that 900 nm TiO$_2$ nanowires give the best result.[19]

TABLE 2

Photovoltaic Performance of Solar Cell with 300, 900, and 1200 nm TiO$_2$ Nanowires as Photoaonde and 80 nm Gold as Back Cathode

| NWs length for cells | $J_{sc}$ (mA m$^{-2}$) | $V_{oc}$ (mV) | FF | η (%) |
|---|---|---|---|---|
| 300 nm | 19.3 | 850 | 0.63 | 10.4 |
| 900 nm | 21.7 | 792 | 0.68 | 11.6 |
| 1200 nm | 9.1 | 722 | 0.73 | 4.7 |

Figure 5:
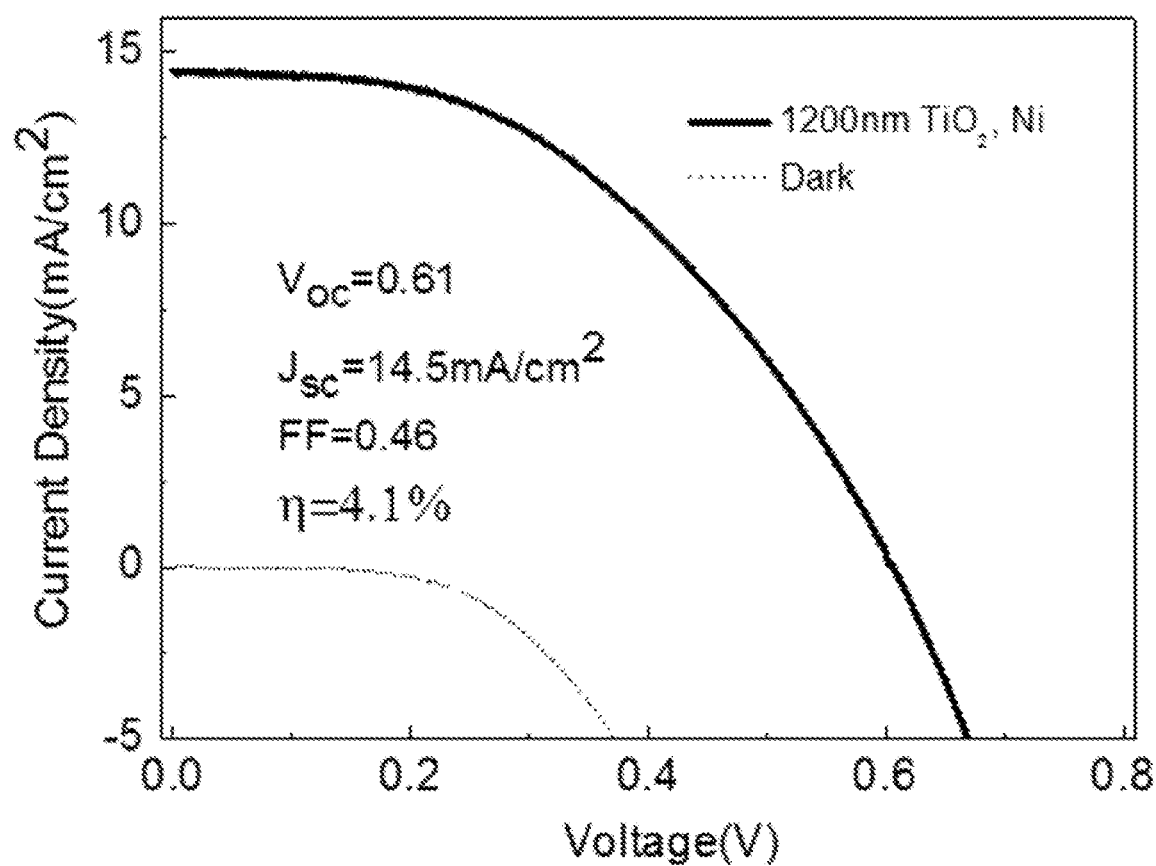
FIG. 5 is a graph of J-V curves of a cell using 1200 nm TiO$_2$ nanowires as anode and 150 nm thick nickel as back cathode.

Further increase of the length of the nanowires deteriorates the cell performance as shown by the device using 1200 nm TiO$_2$ nanowires as anode and 150 nm Ni as cathode, which only reach 4.1% in efficiency (FIG. 5). This trend agrees with the Au-cathoded cells.

Figure 6A:
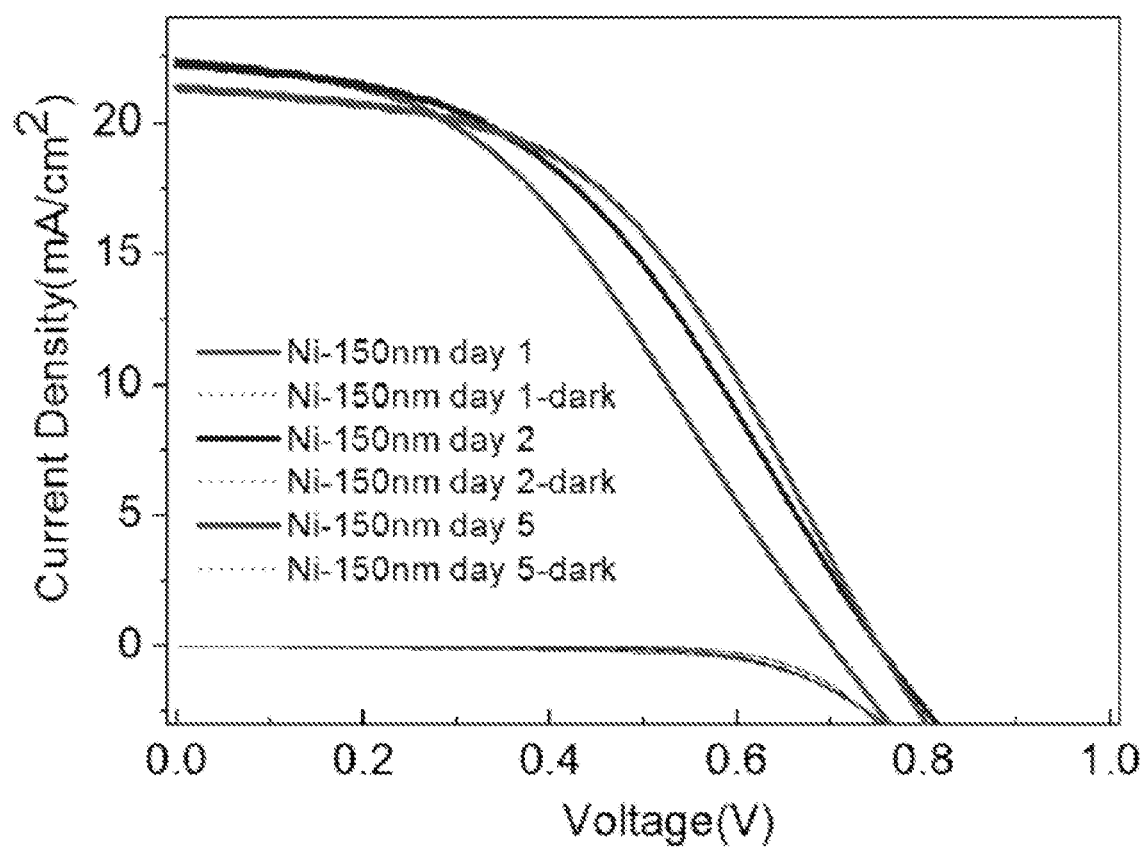
FIG. 6A is a graph of J-V curves for nickel-cathoded cells having 150 nm thick Ni measured on day 1, day 2, and day 5. Between each measurement, the device is stored in a desiccator.
Figure 6B:
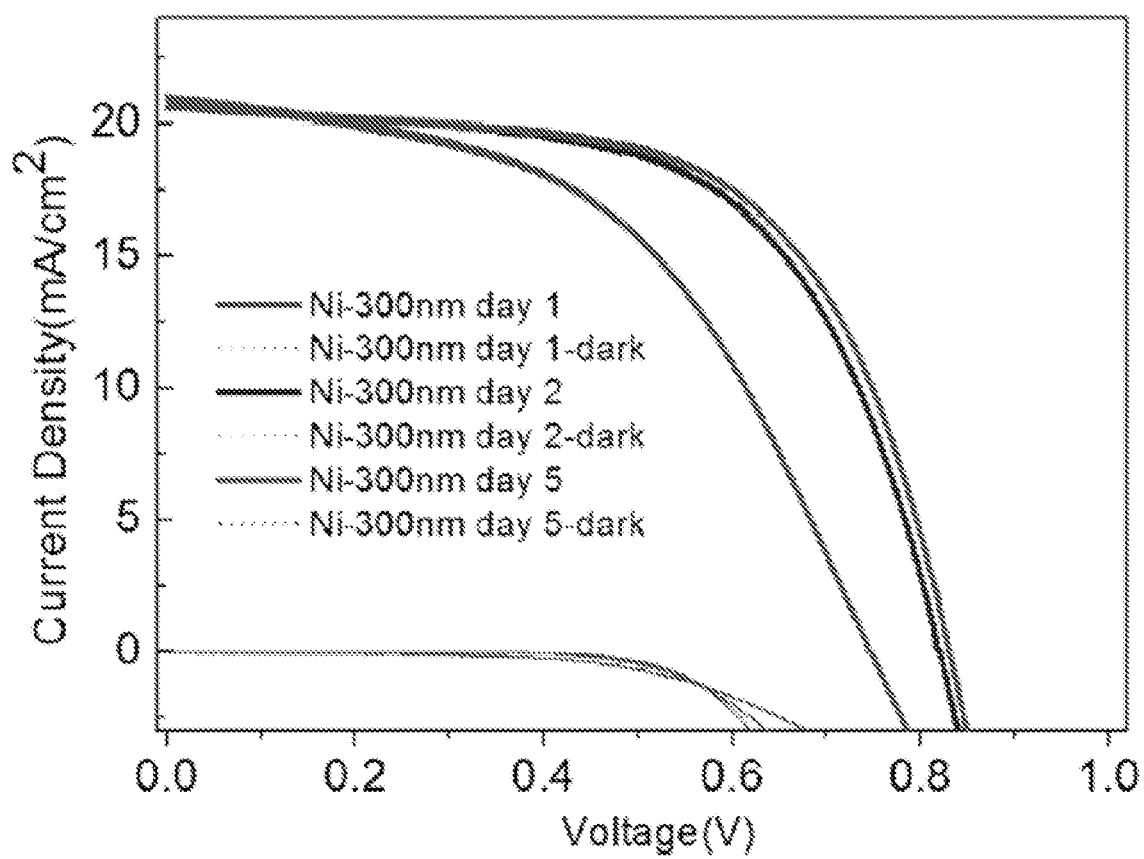
FIG. 6B is a graph of J-V curves for nickel-cathoded cells having 300 nm thick Ni measured on day 1, day 2, and day 5. Between each measurement, the device is stored in a desiccator.

The stability of the photovoltaic performance of the cells using nickel cathodes are also studied as shown in FIGS. 6A and 6B and summarized in Table 3. FIGS. 6A and 6B respectively show the J-V curves of the cells using 150 nm Ni and 300 nm Ni film as the cathode. Explicitly, for the 150 nm Ni-cathoded cell, the $J_{sc}$ decreased from 22.4 mA/cm$^{-2}$ on day 1 to 20.4 mA/cm$^{-2}$ on day 5, and FF increased from 43% on day 1 to 50% on day 5. For the 300 nm Ni-cathoded cell, $V_{oc}$ changed from the 0.70 V on day 1 to 0.75 V on day 5, $J_{sc}$ changed slightly from 20.1 mA/cm$^{-2}$ on day 1 to 20.6 mA/cm$^{-2}$ on day 5, and FF increased from 50% on day 1 to 61% on day 5. We think that the decrease in $J_{sc}$ for the 150 nm Ni-cathoded cell is likely due to the absorption of moisture in the CH$_3$NH$_3$PbI$_3$. The overall efficiencies increase from 6.7% on day 1 to 7.7% on day 5 for the 150 nm Ni-cathoded cell and 7.8% on day 1 to 10.4% on day 5 for the 300 nm Ni-cathoded cell. For comparison, the results for cells with 100 nm nickel cathode are shown in Figure S3[21] and Table S1[21].

Figure 7:
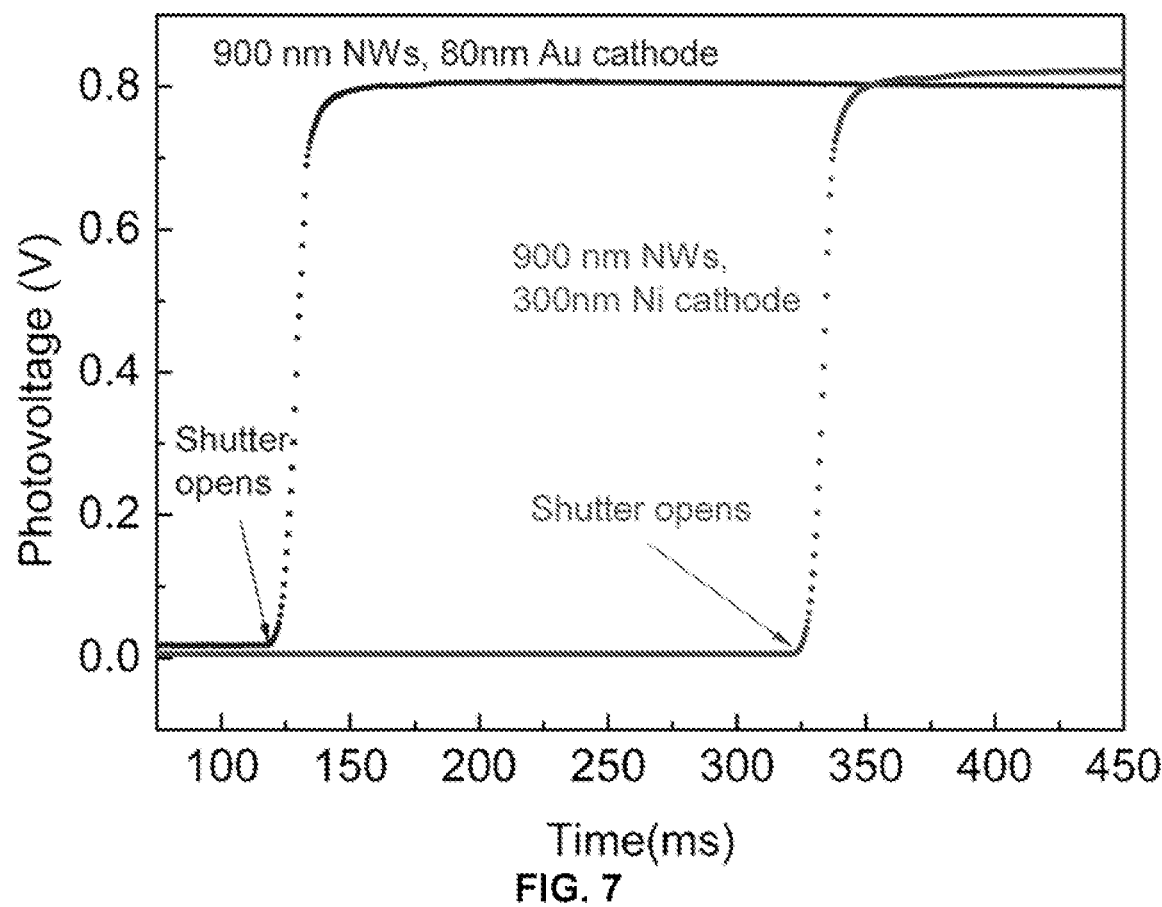
FIG. 7 is a graph of photovoltage rising transients of a 900 nm TiO$_2$ nanowire (NWs) photoanodes devices with 80 nm Au as cathode and a 900 nm TiO$_2$ NWs photoanodes device with 300 nm Ni as cathode.

We further studied the photovoltage rising transients of both gold-cathoded and nickel-cathoded cells. The photovoltage rising transient reflects how rapidly the electrons and holes can be photoinduced and further transport through the internal layers (electrons from perovskite→TiO$_2$→FTO and holes from perovskite→HTM→metals (gold or Ni)) in the presence of the recombination of the above process.[20] FIG. 7 shows that the rising time of $V_{oc}$ (defined as the time it takes from shuttle open to 90% of the full $V_{oc}$) for the Au-cathoded and Ni-cathoded cells are 27.5 and 31.9 ms, respectively. This result suggests that replacement of gold cathode with Ni cathode does not significantly vary the charge transport kinetics. Therefore, nickel is a potentially suitable low-cost metal as cathode in perovskite solar cells. Note that neither the motion of the shutter (response time=0.7 ms from full-close to full-open) nor the data acquisition rate (with the highest rate at 10 µs per data point) is the bottleneck of the above measurement, as confirmed by a commercial ultrafast silicon photodiode (see Figure S4 in Supporting Information[21]).

TABLE 3

Photovoltaic Performance of Solar Cells with Ni as Cathode Measured on Different Days$^a$

| Cell Name | | $J_{sc}$ (mA m$^{-2}$) | $V_{oc}$ (mV) | FF | η (%) |
|---|---|---|---|---|---|
| 150 nm Ni | Day 1 | 22.4 | 702 | 0.43 | 6.7 |
| | Day 2 | 22.2 | 752 | 0.45 | 7.5 |
| | Day 5 | 20.4 | 752 | 0.50 | 7.7 |

TABLE 3-continued

Photovoltaic Performance of Solar Cells with
Ni as Cathode Measured on Different Days[a]

| Cell Name | | $J_{sc}$ (mA m$^{-2}$) | $V_{oc}$ (mV) | FF | η (%) |
|---|---|---|---|---|---|
| 300 nm Ni | Day 1 | 21.0 | 746 | 0.50 | 7.8 |
| | Day 2 | 20.6 | 822 | 0.60 | 10.2 |
| | Day 5 | 20.6 | 830 | 0.61 | 10.4 |

[a]Between each measurement, the devices are stored in a desiccator.

Figure 8:
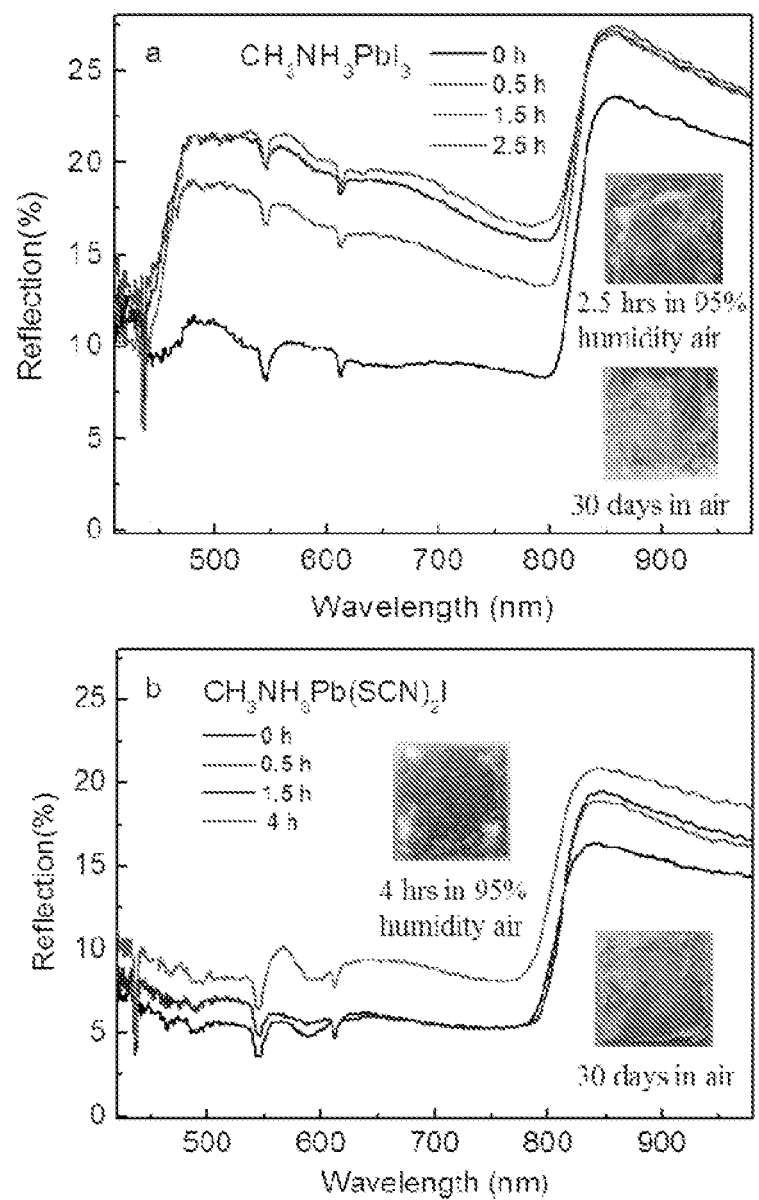
FIG. 8a is a graph of the moisture-tolerance test of conventional CH$_3$NH$_3$PbI$_3$.
FIG. 8b is a graph of the moisture-tolerance test of CH$_3$NH$_3$Pb(SCN)$_2$I.

The accelerated stability tests for perovskite materials were performed by monitoring the reflection of the corresponding perovskite films in 95% humidity air at room temperature. Increase of reflection in FIG. 8a for the conventional $CH_3NH_3PbI_3$ is due to the decomposition of perovskite structure in moisture. As can be seen, conventional perovskite $CH_3NH_3PbI_3$ started to decompose immediately after being exposed to moisture. After 1.5 hours, most of the black film has been decomposed to the yellowish color, originated form $PbI_2$, and the corresponding reflection increases from about 10% to about 20%. In the case of $CH_3NH_3Pb(SCN)_2I$ as shown in FIG. 3b, no obvious reflection increase was observed even after 4 hours exposure to moisture. The corresponding reflection increases only 2% after 4 hour of exposure in moisture, from about 6% to 8% and a tiny white piece emerges at the corner, which is likely due to $Pb(SCN)_2$. In addition, the black color of $CH_3NH_3Pb(SCN)_2I$ film can last for months in air with humidity 40% or below. The lower inserted images in FIGS. 8a and 8b compare the $CH_3NH_3PbI_3$ film and $CH_3NH_3Pb(SCN)_2I$ film after 30 days in air at 20~40% humidity. According to the crystal structure of $CH_3NH_3PbX_3$ perovskite material, ligands between lead and halogen atoms form the frame of the perovskite structure. The first step of degradation in moisture involves a formation of a hydrated intermediate containing isolated $PbX_6^{4-}$ octahedral. The formation constants $K_4$ is calculated to be only 0.35 for $PbI_4^{2-}$, which corresponds to the weak interaction between halogens and lead. In the case of $CH_3NH_3Pb(SCN)_2I$, the interaction between lead and thiocyanate is much stronger and the formation constant $K_4$ is up to 7 for $Pb(SCN)_4^{2-}$. Comparing the spheric shape $I^-$ with the linear shape $SCN^-$ as indicated by its Lewis structure, the lone pair of electrons from S and N in $SCN^-$ can form stronger ligand with Pb, which in turn stabilizes the frame structure of $CH_3NH_3Pb(SCN)_2I$. We show that direct improvement of moisture tolerance for $CH_3NH_3Pb(SCN)_2I$ has been observed in accelerated stability test compared with traditional $CH_3NH_3PbI_3$ perovskite material.

Figure 9:
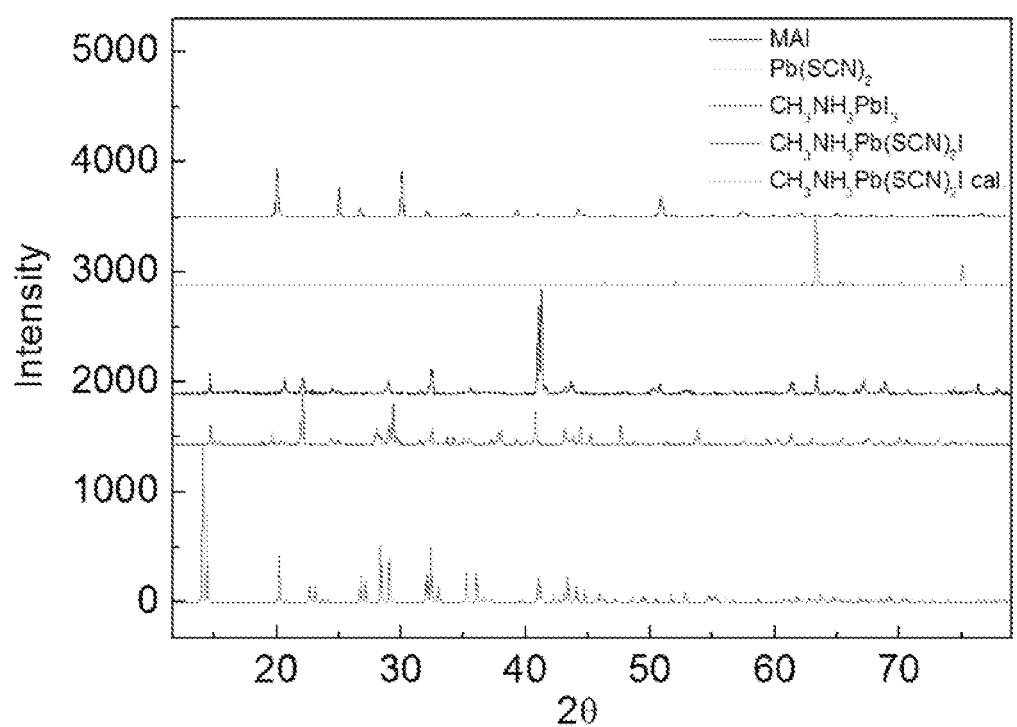
FIG. 9 is an X-ray diffraction (XRD) patterns of CH$_3$NH$_3$Pb(SCN)$_2$I in comparison to the conventional CH$_3$NH$_3$PbI$_3$, along with Pb(SCN)$_2$ and CH$_3$NH$_3$I (MAI).

FIG. 9 collects the X-ray diffraction (XRD) patterns of perovskite type $CH_3NH_3Pb(SCN)_2I$ in comparison to the conventional $CH_3NH_3PbI_3$ film, along with $Pb(SCN)_2$ and $CH_3NH_3I$ (MAI). The typical characteristic XRD peaks (2θ) for the conventional perovskite $CH_3NH_3PbI_3$ at 14, 20, 29, 32, 41 degree, all present as expected. In comparison, these peaks are also found for $CH_3NH_3Pb(SCN)_2I$, which strongly indicates that our $CH_3NH_3Pb(SCN)_2I$ material is also in perovskite structure. The calculated XRD pattern for $CH_3NH_3Pb(SCN)_2I$ matches well with the major XRD peaks from experiment. XRD patterns for $Pb(SCN)_2$ and MAI were also listed in FIG. 2 as references.

REFERENCES (1) Liu, M.; Johnston, M. B.; Snaith, H. J. Efficient Planar Heterojunction Perovskite Solar Cells by Vapour Deposition. Nature 2013, 501, 395-398.

(2) Burschka, J.; Pellet, N.; Moon, S. J.; Humphry-Baker, R.; Gao, P.; Nazeeruddin, M. K.; Gratzel, M. Sequential Deposition as a Route to High-Performance Perovskite-Sensitized Solar Cells. Nature 2013, 499, 316-320.

(3) Kazim, S.; Nazeeruddin, M. K.; Gratzel, M.; Ahmad, S. Perovskite as Light Harvester: A Game Changer in Photovoltaics. Angew. Chem., Int. Ed. 2014, 53, 2812-2824.

(4) Stranks, S. D.; Eperon, G. E.; Grancini, G.; Menelaou, C.; Alcocer, M. J.; Leijtens, T.; Herz, L. M.; Petrozza, A.; Snaith, H. J. Electron-Hole Diffusion Lengths Exceeding 1 Micrometer in an Organometal Trihalide Perovskite Absorber. Science 2013, 342, 341-344.

(5) Leijtens, T.; Eperon, G. E.; Pathak, S.; Abate, A.; Lee, M. M.; Snaith, H. J. Overcoming Ultraviolet Light Instability of Sensitized $TiO_2$ with Meso-Superstructured Organometal Tri-Halide Perovskite Solar Cells. Nat. Commun. 2013, 4, 2885.

(6) Hao, F.; Stoumpos, C. C.; Cao, D. H.; Chang, R. P. H.; Kanatzidis, M. G. Lead-Free Solid-State Organic-Inorganic Halide Perovskite Solar Cells. Nat. Photonics 2014, 8, 489-494.

(7) Qin, P.; Tanaka, S.; Ito, S.; Tetreault, N.; Manabe, K.; Nishino, H.; Nazeeruddin, M. K.; Gratzel, M. Inorganic Hole Conductor-Based Lead Halide Perovskite Solar Cells with 12.4% Conversion Efficiency. Nat. Commun. 2014, 5, 3834.

(8) Christians, J. A.; Fung, R. C.; Kamat, P. V. An Inorganic Hole Conductor for Organo-Lead Halide Perovskite Solar Cells. Improved Hole Conductivity with Copper Iodide. J. Am. Chem. Soc. 2014, 136, 758-764.

(9) Li, H.; Fu, K.; Hagfeldt, A.; Gratzel, M.; Mhaisalkar, S. G.; Grimsdale, A. C. A Simple 3,4-Ethylenedioxythiophene Based Hole-Transporting Material for Perovskite Solar Cells. Angew. Chem., Int. Ed. 2014, 53, 4085-4088.

(10) Zhu, Z.; Ma, J.; Wang, Z.; Mu, C.; Fan, Z.; Du, L.; Bai, Y.; Fan, L.; Yan, H.; Phillips, D. L.; et al. Efficiency Enhancement of Perovskite Solar Cells through Fast Electron Extraction: The Role of Graphene Quantum Dots. J. Am. Chem. Soc. 2014, 136, 3760-3763.

(11) Ku, Z.; Rong, Y.; Xu, M.; Liu, T.; Han, H. Full Printable Processed Mesoscopic $CH_3NH_3PbI_3/TiO_2$ Heterojunction Solar Cells with Carbon Counter Electrode. Sci. Rep. 2013, 3, 3132.

(12) Lide, D. R. Handbook on Chemistry and Physics, 88th ed.; CRC: Boca Raton, F L, 2008; p 2640.

(13) Feng, X.; Zhu, K.; Frank, A. J.; Grimes, C. A.; Mallouk, T. E. Rapid Charge Transport in Dye-Sensitized Solar Cells Made from Vertically Aligned Single-Crystal Rutile $TiO_2$ Nanowires. Angew. Chem., Int. Ed. 2012, 51, 2727-2730.

(14) Etgar, L.; Gao, P.; Xue, Z.; Peng, Q.; Chandiran, A. K.; Liu, B.; Nazeeruddin, M. K.; Gratzel, M. Mesoscopic $CH_3NH_3PBi_3/TiO_2$ Heterojunction Solar Cells. J. Am. Chem. Soc. 2012, 134, 17396-17399.

(15) Zhao, Y. X.; Zhu, K. Charge Transport and Recombination in Perovskite $CH_3NH_3PbI_3$ Sensitized $TiO_2$ Solar Cells. J. Phys. Chem. Lett. 2013, 4, 2880-2884.

(16) Snaith, H. J.; Abate, A.; Ball, J. M.; Eperon, G. E.; Leijtens, T.; Noel, N. K.; Stranks, S. D.; Wang, J. T. W.; Wojciechowski, K.; Zhang, W. Anomalous Hysteresis in Perovskite Solar Cells. J. Phys. Chem. Lett. 2014, 5, 1511-1515.

(17) Dualeh, A.; Moehl, T.; Tetreault, N.; Teuscher, J.; Gao, P.; Nazeeruddin, M. K.; Gratzel, M. Impedance Spectroscopic Analysis of Lead Iodide Perovskite-Sensitized Solid-State Solar Cells. ACS Nano 2014, 8, 362-373.

(18) Green, M. A. Solar Cells: Operating Principles, Technology and System Applications; Holonyak, N., Jr., Ed.; Prentice-Hall, Inc.: Englewood Cliffs, N.J., 1982; pp 96-97.

(19) Jiang, Q.; Sheng, X.; Li, Y.; Feng, X.; Xu, T. Rutile $TiO_2$ Nanowires Perovskite Solar Cells. Chem. Commun. 2014, DOI: 10.1039/C4CC07367C.

(20) O'Regan, B. C.; Bakker, K.; Kroeze, J.; Smit, H.; Sommeling, P.; Durrant, J. R. Measuring Charge Transport from Transient Photovoltage Rise Times. A New Tool to Investigate Electron Transport in Nanoparticle Films. J. Phys. Chem. B 2006, 110, 17155-17160.

(21) Qinglong Jiang, Xia Sheng, Bing Shi, Xinjian Feng, and Tao Xu J., Nickel-Cathoded Perovskite Solar Cells, Phys. Chem. C 2014, 118, 25878-25883, supplemental information.

(22) Q. Jiang, X. Sheng, Y. Li, X. Feng, T. Xu, *Chem Commun (Camb)* 2014, 50, 14720-14723.

(23) G. D. Niu, W. Z. Li, F. Q. Meng, L. D. Wang, H. P. Dong, Y. Qiu, *J Mater Chem A* 2014, 2, 705-710.

(24) A. Abate, M. Saliba, D. J. Hollman, S. D. Stranks, K. Wojciechowski, R. Avolio, G. Grancini, A. Petrozza, H. J. Snaith, *Nano Lett* 2014, 14, 3247-3254.

(25) B. D. S. Jinli Yang, Dianyi Liu, Timothy L. Kelly, *Acs Nano* 2015, 9, 1955-1963.

(26) Q. Chen, H. P. Zhou, T. B. Song, S. Luo, Z. R. Hong, H. S. Duan, L. T. Dou, Y. S. Liu, Y. Yang, *Nano Lett* 2014, 14, 4158-4163.

(27) B. P. Byung-wook Park, Torbjõrn Gustafsson, Kári Sveinbjõrnsson, Anders Hagfeldt, Erik M. J. Johansson, Gerrit Boschloo, *Chem. Mater.* 2014, 26, 4466-4471.

(28) T. Baikie, Y. N. Fang, J. M. Kadro, M. Schreyer, F. X. Wei, S. G. Mhaisalkar, M. Graetzel, T. J. White, *J Mater Chem A* 2013, 1, 5628-5641.

What is claimed is:

1. A photovoltaic device, comprising:
(1) a first conductive layer,
(2) an electron blocking layer, on the first conductive layer,
(3) a semiconductor layer, on the electron blocking layer,
(4) a light-harvesting material, on the semiconductor layer,
(5) a hole transport material, on the light-harvesting material, and
(6) a second conductive layer, on the hole transport material,
wherein the light-harvesting material comprises a perovskite absorber, and
the second conductive layer comprises nickel having a thickness of at least 150 nm.

2. The photovoltaic device of claim 1, wherein the first conductive layer is transparent.

3. The photovoltaic device of claim 1, wherein the light-harvesting material comprises $CH_3NH_3PbY_2X$, wherein Y is SCN, and X is selected from the group consisting of F, Cl, Br, or I.

4. The photovoltaic device of claim 1, wherein the light-harvesting material comprises a lead compound.

5. The photovoltaic device of claim 4, wherein the light-harvesting material comprises $CH_3NH_3PbX_3$ or $H_2NCHNH_2PbX_3$, and X is selected from the group consisting of F, Cl, Br, or I.

6. The photovoltaic device of claim 1, wherein the semiconductor layer comprises $TiO_2$.

7. The photovoltaic device of claim 1, wherein the hole transport material comprises spiro-MeOTAD.

8. The photovoltaic device of claim 1, wherein the first conductive layer comprises at least one transparent conductor selected from the group consisting of indium-tin oxide, fluorinated tin oxide and aluminum-zinc oxide.

9. The photovoltaic device of claim 1 wherein the semiconductor layer comprises $TiO_2$ nanowires.

10. The photovoltaic device of claim 9, wherein the $TiO_2$ nanowires have a length of at most 1000 nm.

11. The photovoltaic device of claim 1, wherein the photovoltaic device has a power conversion efficiency of at least 7.7%.

12. The photovoltaic device of claim 1, wherein the photovoltaic device has a power conversion efficiency of at least 10.4%.

13. The photovoltaic device of claim 1, wherein the second conductive layer comprises nickel having a thickness of at least 300 nm.

14. A photovoltaic device, comprising:
(1) a first conductive layer,
(2) an electron blocking layer, on the first conductive layer,
(3) a semiconductor layer, on the electron blocking layer,
(4) a light-harvesting material, on the semiconductor layer,
(5) a hole transport material, on the light-harvesting material, and
(6) a second conductive layer, on the hole transport material,
wherein the light-harvesting material comprises a perovskite absorber, and
the semiconductor layer comprises $TiO_2$ nanowires having a length of at most 1000 nm.

15. The photovoltaic device of claim 14, wherein the first conductive layer is transparent.

16. The photovoltaic device of claim 14, wherein the light-harvesting material comprises $CH_3NH_3PbY_2X$, wherein Y is SCN, and X is selected from the group consisting of F, Cl, Br, or I.

17. The photovoltaic device of claim 14, wherein the light-harvesting material comprises a lead compound.

18. The photovoltaic device of claim 17, wherein the light-harvesting material comprises $CH_3NH_3PbX_3$ or $H_2NCHNH_2PbX_3$, and X is selected from the group consisting of F, Cl, Br, or I.

19. The photovoltaic device of claim 14, wherein the hole transport material comprises Spiro-MeOTAD.

20. The photovoltaic device of claim 14, wherein the first conductive layer comprises at least one transparent conductor selected from the group consisting of indium-tin oxide, fluorinated tin oxide and aluminum-zinc oxide.

21. The photovoltaic device of claim 14, wherein the $TiO_2$ nanowires have a length of 300 to 900 nm.

22. The photovoltaic device of claim 14, wherein the $TiO_2$ nanowires are prepared by a solvothermal method.

* * * * *